United States Patent [19]

Rudy, Jr. et al.

[11] Patent Number: 5,381,314

[45] Date of Patent: Jan. 10, 1995

[54] HEAT DISSIPATING EMI/RFI PROTECTIVE FUNCTION BOX

[75] Inventors: William J. Rudy, Jr., Annville; Howard R. Shaffer, Millersburg; Daniel E. Stahl, Hummelstown, all of Pa.

[73] Assignee: The Whitaker Corporation, Wilmington, Del.

[21] Appl. No.: 76,654

[22] Filed: Jun. 11, 1993

[51] Int. Cl.⁶ .................................................. H05K 7/20
[52] U.S. Cl. ................................ 361/712; 257/729; 361/800; 439/79
[58] Field of Search ............... 211/41; 165/80.3, 185; 174/35 R; 257/706, 712, 713, 729; 439/59, 61, 64, 67, 76–79, 160, 260, 266, 485, 487; 361/690, 704, 707, 709, 712, 719, 749, 789, 796, 800, 801, 802, 803, 816, 818, 820

[56] References Cited

U.S. PATENT DOCUMENTS

| | | | |
|---|---|---|---|
| 3,299,946 | 1/1967 | von Rechlinghausen | 165/80 |
| 3,640,141 | 2/1972 | Hollingsead et al. | 74/89.15 |
| 3,733,523 | 5/1973 | Reynolds | 211/41 |
| 3,925,710 | 12/1975 | Ebert | 317/100 |
| 4,134,631 | 1/1979 | Conrad et al. | 339/17 M |
| 4,156,794 | 5/1979 | Robinson | 174/16 R |
| 4,363,075 | 12/1982 | DeRemer | 361/383 |
| 4,525,769 | 6/1985 | Lehmann | 361/386 |
| 4,582,374 | 4/1986 | Conrad et al. | 339/17 M |
| 4,620,263 | 10/1986 | Ito | 361/383 |
| 4,735,583 | 4/1988 | Rudy, Jr. et al. | 439/350 |
| 4,769,557 | 9/1988 | Houf et al. | 307/147 |
| 4,777,560 | 10/1988 | Herrell et al. | 361/384 |
| 4,808,115 | 2/1989 | Norton et al. | 439/79 |
| 4,836,789 | 6/1989 | Rudy, Jr. et al. | 439/64 |
| 4,837,663 | 6/1989 | Zushi et al. | 361/384 |
| 4,838,041 | 6/1989 | Bellows et al. | 62/51.2 |
| 4,840,286 | 6/1989 | Heberling et al. | 220/306 |
| 4,846,699 | 7/1989 | Glover et al. | 439/64 |
| 4,872,102 | 10/1989 | Getter | 363/141 |
| 4,914,551 | 4/1990 | Anschel et al. | 361/389 |
| 4,953,058 | 8/1990 | Harris | 361/383 |
| 4,995,821 | 2/1991 | Casey | 439/157 |
| 5,031,075 | 7/1991 | Casanova | 361/415 |
| 5,045,977 | 9/1991 | Cesar | 361/424 |
| 5,057,909 | 10/1991 | Mok et al. | 357/81 |
| 5,065,278 | 11/1991 | Schultz | 361/383 |
| 5,065,280 | 11/1991 | Karnezos et al. | 361/386 |
| 5,130,896 | 7/1992 | Babb et al. | 361/424 |
| 5,150,278 | 9/1992 | Lynes et al. | 361/386 |
| 5,229,924 | 7/1993 | Zell | 361/415 |

OTHER PUBLICATIONS

IEEE Conference Proceedings, A Printed—Height, pp. 332–340, C. L. Winings, Apr. 1980 (361-801).
RCA Tech. Notes, Printed Circuit—Assembly, Charles Tighe, Jr. et al., pp. 1–6, Sep. 1973 (361-801).
Calmark Catalog, "Series 225-Card-Lok Retainer (Cold Plate)"; p. 12; Calmark Corporation, San Gabriel, Calif.
Magtron Brochure, "Electronic Packaging . . . "; eight pages; Devtek Aerospace Company, Mississauga, Ontario, Canada.
Sparta Leaflet, "Sparta's Advanced Composite ¾ ATR Electronic Enclosures"; one page; Sparta, Inc.

*Primary Examiner*—Gerald P. Tolin
*Attorney, Agent, or Firm*—Anton P. Ness

[57] ABSTRACT

A junction box (10) defining an enclosed card cage and including a backplane assembly (200) for interconnecting circuits of daughter cards (130) with associated conductors extending thereinto at an input/output interface. The junction box (10) includes a front panel (50) removable from the front face to permit insertion and removal of respective daughter cards, and includes an array of interior fins (58) engaged with the daughter cards at thermal junctions (64) and an array of exterior fins (52) for dissipating the thermal energy. The rear wall (14) includes shield sections (214) surrounding input/output connectors (208) joined to the backplane assembly. The junction box (10) prevents EMI/RFI leakage therethrough.

11 Claims, 17 Drawing Sheets

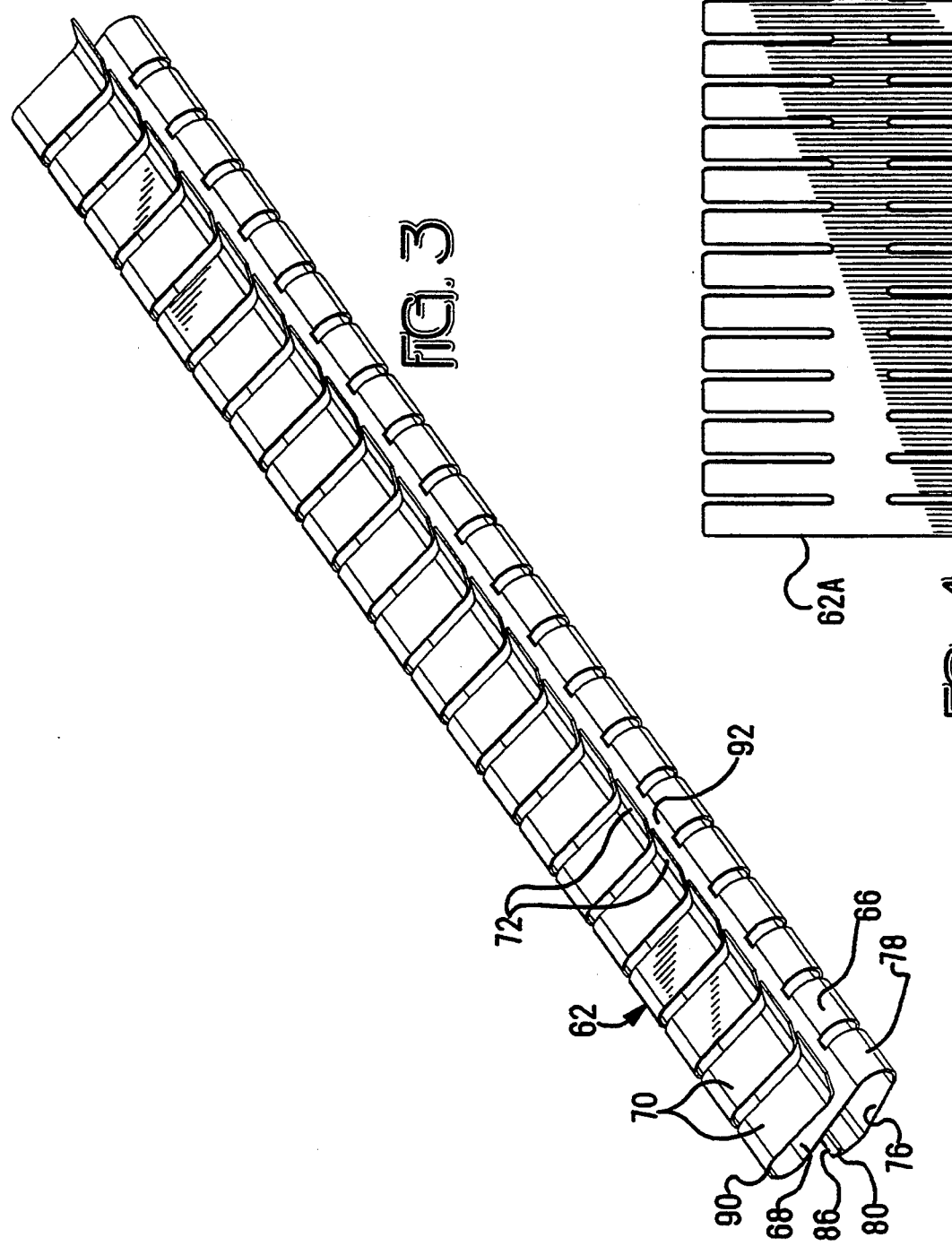

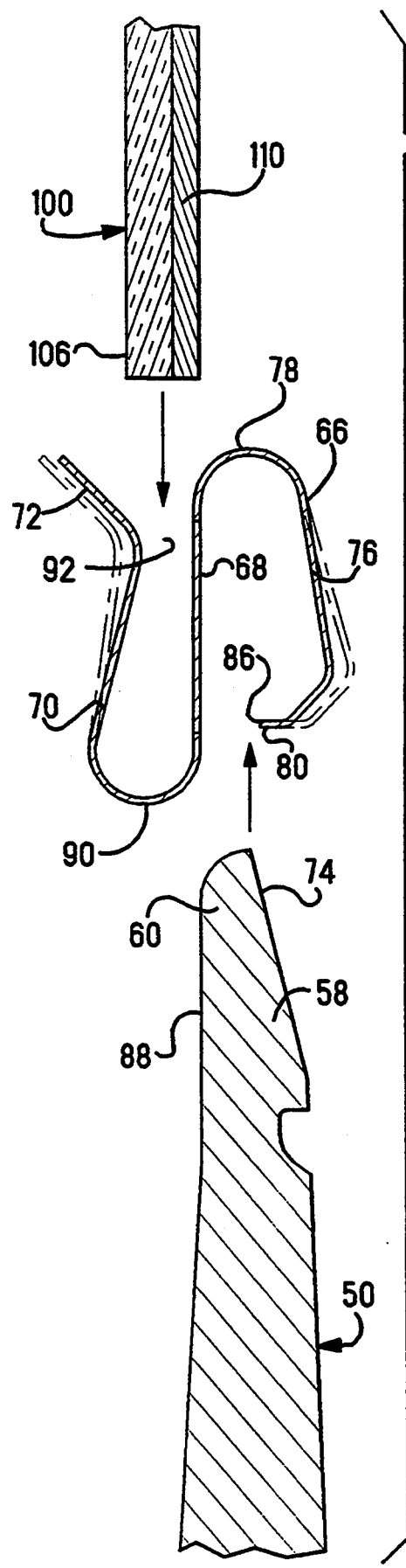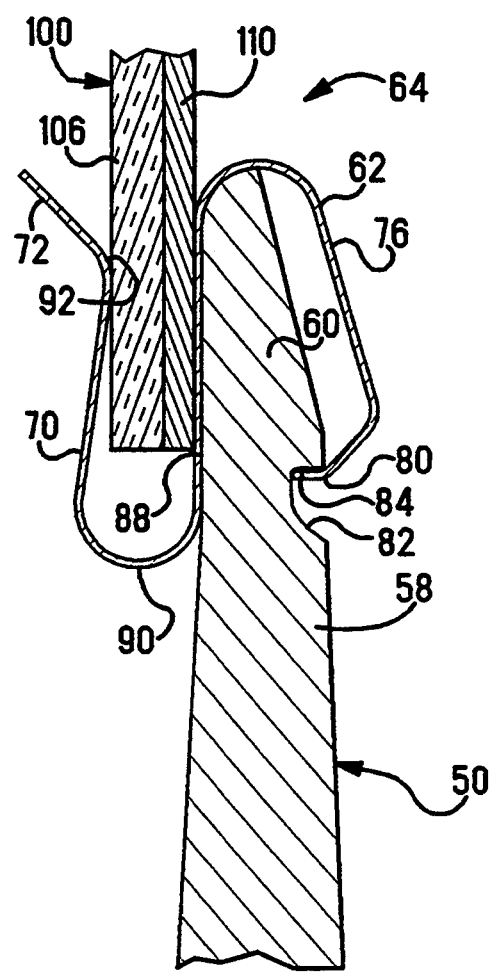

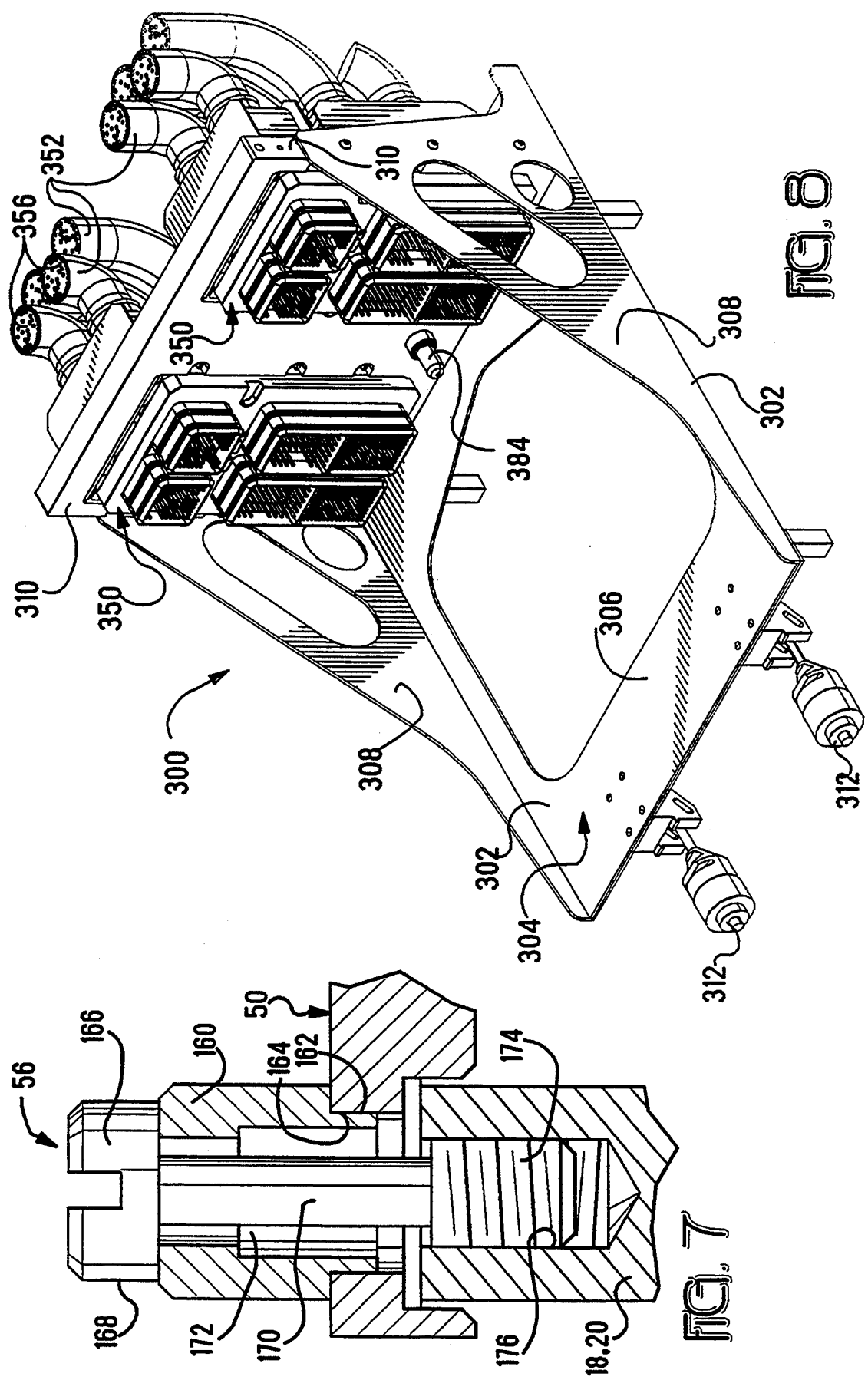

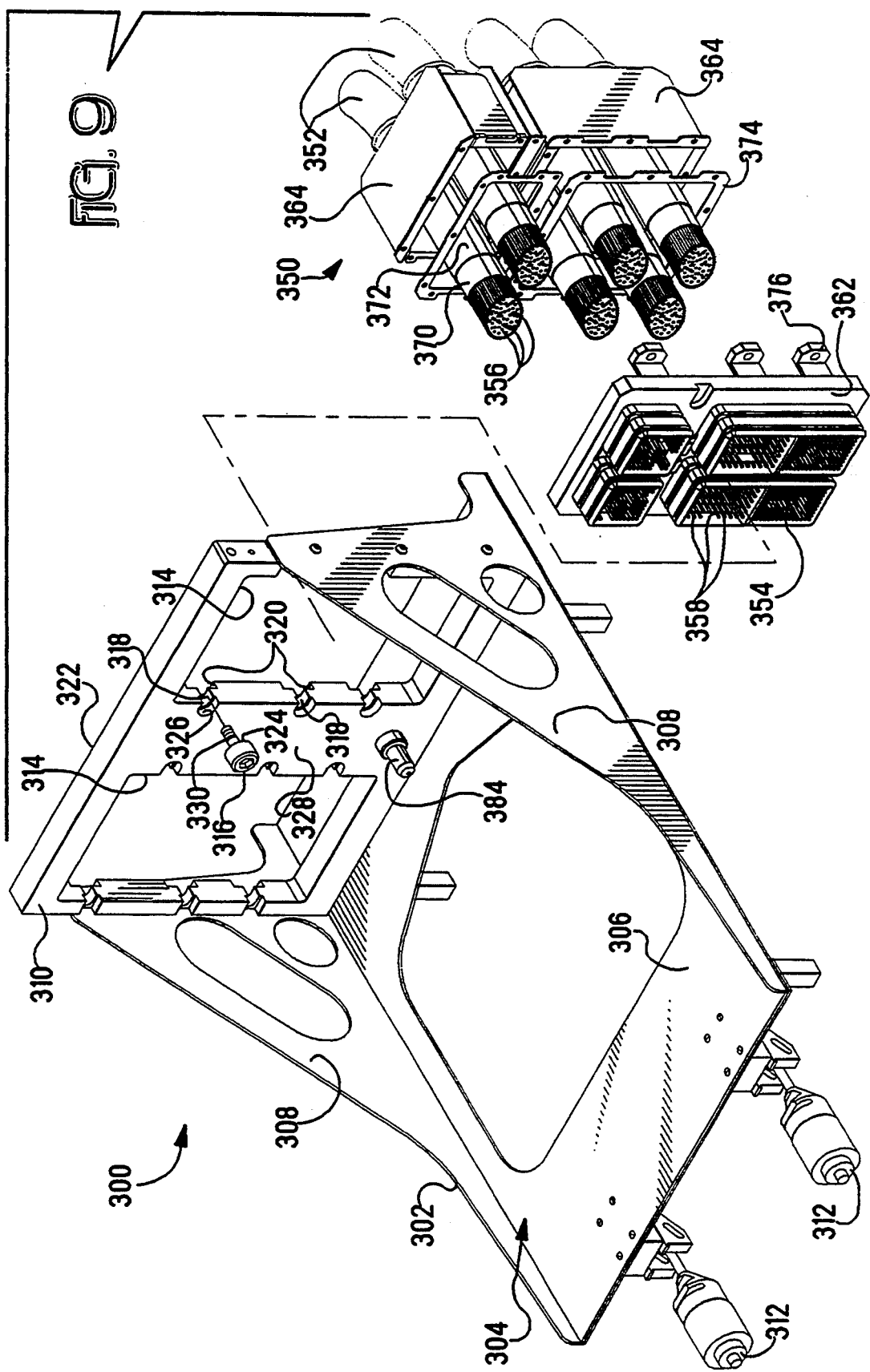

HEAT DISSIPATING EMI/RFI PROTECTIVE FUNCTION BOX

FIELD OF THE INVENTION

The present invention is directed to the field of structures for containing electrical and electronic components and systems, and more particularly to enclosures for circuit boards and connections thereof to electrical conductor cables.

BACKGROUND OF THE INVENTION

Card cages are known, in which a framework is provided to define a card receiving region in which pairs of card guides establish locations for insertion of daughter cards therealong, for connectors mounted at a leading edge of each thereof to mate with corresponding connectors of a backplane traversing the rear of the card receiving region. The backplane provides for electrical connections of the circuits of each daughter card inserted to circuits of other daughter cards as desired or to conductors of input/output cable. One such card cage is disclosed in U.S. Pat. No. 4,846,699 directed to a system for providing electrical power to the components mounted on the daughter cards.

A backplane is disclosed in U.S. Pat. No. 4,582,374 which interconnects a high density of signal circuits of cards mountable along a front face thereof with corresponding circuits along a back face thereof, as well as providing power interconnections and ground.

Another particular form of card cage is disclosed in U.S. Pat. No. 4,808,115 in which circuit cards mounted within modules are insertable into an enclosure or box commonly referred to as a black box and containing a mother board to which the circuit cards are interconnected. The modules are referred to as line replaceable modules.

Aircraft have a great many electrical circuits interconnecting a variety of electrical articles thereon such as black boxes, sensors, instrument panels and the like, and the circuits are commonly interconnected in regions termed electronics bays. Various arrangements have been devised to provide for disconnectable interconnections of the circuits and are known as wire integration systems. Two such systems are disclosed in U.S. Pat. Nos. 4,735,583 and 4,995,821. Discrete wire conductors are used to define the interconnections.

SUMMARY OF THE INVENTIONS

The present invention provides an enclosure for an array of individual circuit boards or daughter cards, a backplane assembly to which the circuit boards are electrically connectable and disconnectable, and an input/output interface for electrically connecting the backplane to cables of discrete electrical conductors, all thus defining a junction box. The junction box includes a front panel traversing the front face which is adapted to be removable from the enclosure, a pair of opposing side walls, upper and lower walls which include opposed pairs of card-guiding channels extending rearwardly from the front face, a backplane assembly traversing the rearward region of the enclosure, and a rear wall which completes the enclosure and provides for electrical connections of cables to the backplane assembly. The junction box defines an integral rugged electrically and thermally conductive envelope surrounding the backplane assembly and daughter cards which provides protection against electromagnetic interference (EMI) and radiofrequency interference (RFI) to assure the integrity of signals received, processed and transmitted by the electronic circuitry and components therewithin. The junction box also provides heat dissipation for the components therewithin which have been isolated from the otherwise cooling effect of ambient air flow usually relied upon to remove thermal energy from electronics bays.

The junction box is mountable to a shelf or other frame structure as is conventional, in a manner similar to that used for securing black boxes in electronics bays of aircraft, and using a rack similar to conventional racks. Used in association with the junction box is a rugged frame mounted to the rack just rearwardly of the junction box on which are mounted connectors terminating the cables to be electrically connected to the backplane assembly within the junction box. Mating faces of the cable connectors face forwardly to mate with corresponding mating faces of cable-associated connectors of the backplane assembly exposed along the rear wall and facing rearwardly. During typical mounting of the junction box into its in-service location, the cables will already be installed in position within the aircraft with the cable connectors secured to the rugged frame mounted to the rack. The junction box is then positioned on the rack and urged rearwardly to its installed location, with the cable-associated connectors defined on the rear wall mate with the cable connectors float-mounted to the rugged frame, in a blind mating or rack-and-panel arrangement. Preferably a large diameter pin extends forwardly from the frame to be received into a corresponding hole of the rear wall of the junction box, cooperating to enhance resistance to vibration and to wear. The junction box is then secured in position by cooperation of locking mechanisms secured to the rack with complementary lock embossments on the bottom surface of the lower wall at the front face. Electrically conductive gaskets surround every opening in the junction box to provide an EMI/RFI seal at each possible incremental gap during in-service use, including the periphery of the front panel and the periphery of the mating faces of the cable-associated connector along the rear wall.

The front panel is securable to and removable from the junction box in its installed condition, thus enabling insertion and removal of individual daughter cards from the junction box as desired and without requiring removal of the junction box from its installed position. Preferably the front panel includes a pair of handles facilitating manipulation thereof. With the front panel removed, each daughter card in a vertical orientation can be moved along an associated pair of opposed guide channels extending rearwardly from the front face to the forward face of the backplane assembly, and then clamped in the fully inserted position all in a manner similar to conventional card cages. The front panel includes an array of fins along the exterior surface for dissipating thermal energy transmitted from the interior during in-service use, by increasing the surface area exposed to ambient air currents surrounding the junction box. Along the interior surface of the front panel is an array of fins at least including one associated with the edge of each daughter card proximate the front face after insertion, and preferably each interior fin includes a ground clip mounted along the leading edge thereof to become firmly engaged with the adjacent edge of the associated daughter card to establish a ground connection and a thermal connection with an electrically and thermally conductive layer of the daughter card to establish an enhanced heat-removal mechanism, as well as a means for minimizing crosstalk between components of the various daughter cards. Such ground clips mounted along the interior fins are adapted to mate simultaneously with the front edges of all the respective daughter cards in a blind mate manner.

The backplane assembly includes a forward face associated with the daughter cards, and a rearward face associated with the cables. Preferably the rearward face is defined by the rear wall of the junction box, and the forward face is defined by a rugged interior panel member mounted within the junction box. The forward face contains an array of daughter card-associated electrical connectors facing forwardly to be matable with complementary connectors mounted on rear edges of the daughter cards, and appropriately positioned with respect to the card-guiding channels to become mated upon insertion of the daughter cards, with the daughter card-associated connectors mounted within apertures of the interior panel. Preferably the card-associated connectors are mounted in a manner permitting incremental adjustment in the plane of the panel to precisely self-align the front contact sections of the arrays of electrical contacts with contact sections of corresponding arrays of complementary contacts of the card edge connectors mounted on the daughter cards for remote mating during daughter card insertion, enabling mating of the individual pairs of mating contacts.

The rear contact sections of the electrical contacts of the daughter card-associated connectors are electrically connected to respective termini of circuit paths of a circuit-bearing element which extend to opposed termini electrically connected to rear contact sections of corresponding electrical contacts of cable-associated connectors mounted in the rear junction box wall. Front contact sections of the corresponding contacts are exposed for mating with complementary contact sections of the contacts in the cable connectors secured in cutouts through the rear frame. The backplane assembly thus electrically interconnects respective circuits or wires of the cables with appropriate circuits of the daughter cards.

The junction box of the present invention and the backplane assembly also are especially useful to define a wire integration system, in which circuits of the daughter cards can be connected as desired to any particular conductor of the input/output interface. A discrete member such as a circuit card insertable into the card cage, is disclosed which selectively interconnects the circuits through the interconnection circuitry of the backplane assembly. Such a discrete member, or matrix card, can be programmed and reprogrammed easily, with no changes being made which involve specific use customization or modification to the backplane assembly, and which greatly simplifies backplane construction for a high density of thousands of individual circuits.

The rear wall includes integral shrouds surrounding the mating faces of the cable-associated connectors which interfit with complementary shrouds of the cable connectors in a conventional plug/receptacle manner, and EMI/RFI ground members are mounted peripherally around the plug shrouds to establish a ground connection with the interior surface of the receptacle shrouds thus grounding the cable shields to the junction box and also assuring no EMI/RFI gap surrounding the mating faces of the connectors in the mated condition, and adapted to maintain such ground connection during mechanical vibration during in-service use. Preferably the cable connectors are mounted in apertures of the rugged frame in a manner permitting incremental transverse movement during mating upon initiation of the interfitting of the plug shrouds with the receptacle shrouds to precisely align the arrays of mating contact sections of the mating connectors, all as the junction box is being urged into its in-service position in the rack.

Backshells are easily mounted to the cable connectors and enclose the lengths of discrete conductor wires extending from each cable for EMI/RFI protection, and include integral flanges to which the shielding braids of each cable are affixed for grounding thereof; and the backshells are adapted to be clamped to the cable outer insulative jackets to provide strain relief for the cable connectors. Each backshell may be an integral four-sided member first placed loosely onto the cable prior to terminating the conductors thereof to respective terminals and securing the terminals into the housings of the cable connectors, and then moved against the rugged metal shell of the cable connector and mounted thereto before securing the loaded connectors into respective apertures of the rugged frame of the rack assembly, and then securing the shielding braid about the backshell flange. In a second embodiment, a backshell may also be assembled about the connector after conductor termination and securing the connector to the frame, in which case the backshell may later be opened to repair or replace a terminal without first requiring total connector removal, and also permitting the drain wires to be grounded to the backshell.

Preferably the circuit-bearing element is defined by an array of overlaid layers of thin flexible circuit elements or films permitting substantial latitude in the routing of the discrete circuits. Such an arrangement permits the termini connected to the card-associated connectors to be defined in a plurality of first high density three-dimensional arrays at a central region of the films adjacent the rearward surface of the interior panel and associated with respective ones of the card-associated connectors; the circuits then extend laterally within the various layers of flexible elements to intermediate regions laterally of the first arrays to outer regions containing the second arrays thereof; the intermediate regions enable the circuit-bearing element to define gentle 180° bends for outer regions to be doubled back to be parallel to and adjacent the rear wall with the circuits concluding in termini defined in a plurality of high density three-dimensional arrays independent of the first arrays for electrical connection to the contacts of the cable-associated connectors.

The backplane assembly can be fabricated as a subassembly with the interior panel and rear wall mounted to a plurality of posts about the peripheries thereof, with the circuit-bearing element mounted therebetween already electrically interconnecting the associated contact members of the cable-associated connectors and card-associated connectors. The plurality of posts preferably are guide members insertable into and along opposed pairs of channels defined at least along the interior surfaces of the upper and lower walls of the junction box extending forwardly from rear edges thereof, all positioned to align the card-associated connectors with the appropriate card-guiding channels. Fabrication of the backplane assembly can be accomplished by mounting the card-associated connectors the interior panel, joining the rear contact sections of the contacts mounted in the dielectric housings thereof appropriate termini of the flexible film circuits and joining the opposed termini to appropriate contact sections of contacts of the cable-associated connectors, and then securing the cable-associated connectors to the rear wall. Preferably all of the film layers include pin-receiving holes at all locations aligned with all electrical contacts of all of the cable-associated and card-associated connectors, with the circuit traces extending to termini for the associated contact and isolated from all other pin-receiving holes and with the traces except at the termini being disposed between two layers of dielectric material, as is conventional in flexible films.

One such process involves a layer-by-layer evolution by placing the first or outermost film over the pin contact sections of all of the connectors to extend through the respective holes, and joining selected termini defined on the first film layer to the appropriate contacts of the cable-associated connectors and card-associated connectors; placing the second film layer over the first layer with pin contact sections through the holes and connecting its termini to corresponding contacts; and continuing until all layers are thus connected. Each film layer is adapted to achieve the ultimate 180° bends to each side of the circuit-bearing element by having incrementally different lateral lengths of the intermediate regions of the films between the first and second arrays, with the first or outermost layer having the greatest lateral length and the last or innermost layer having the least. As the layers are carefully built up, the incremental difference in intermediate region lengths results in inherent bends of the multilayer structure to each side.

Alternatively, the layers may be initially stacked with the hole arrays aligned at the card-associated region at the center of the films, and the layers firmly adhered together at the center such as by clamping and potting along the periphery; the holes are then plated in a process akin to multi-layer printed circuit board fabrication, in which the plating material extends along the aligned holes between the two outermost layers, but with a conductive connection only with the trace of the terminus of the particular layer with which an electrical connection to a connector pin is ultimately desired while plating material engages only dielectric material of the other layers adjacent the respective hole. Then upon insertion of pins through all such plated holes and soldering of the pin end to the plating material at the exposed outer layer, the pin is conductively connected to the desired terminus. Connection of the cable-associated hole arrays can be performed similarly with the plural layers formed about 180° and then adhered at the ends after the hole arrays are aligned and then plated and soldered, or as described in the first process.

Preferably each daughter card rear edge includes connectors mounted thereto to be disposed in large cavities of an integral rugged conductive shell member mounted to the daughter card rear edge. The integral shell includes a card-mounting post by conventional mounting hardware at each end and a centrally located mounting post which is precisely positioned with respect to the termini arrays of the circuits of the daughter card and thus defines a datum or reference for the electrical contacts contained in the dielectric housings of the daughter card connectors. This arrangement assures that the contacts already assembled within respective passageways of the housings prior to being electrically connected to the respective termini, are inherently precisely positioned by the housings within the large cavities of the integral shell. This arrangement also enables use of standard card-edge mountable connectors. The integral shell further includes a forwardmost face which is adapted to initially engage leading edges of the card-associated connectors mounted in the interior panel of the backplane assembly and incrementally laterally adjust the position thereof to precisely align the contacts therein with the associated contacts of the daughter card connectors for blind mating. Also the integral shell may have key members complementary with keys affixed to the interior panel so that only the appropriate daughter card is physically able to be fully inserted into the selected card location defined by the card-guiding channels for its connectors to mate with the card-associated connectors. Such integral shells also assist in minimizing crosstalk between unrelated circuits and components within the junction box, and are electrically and thermally connected to the metal layer of each of the daughter cards, which are electrically and thermally connected to the front panel of the junction box for grounding and heat dissipation.

In addition to the array of daughter cards containing electronic components mounted thereon including for example microprocessors and integrated circuits, the junction box includes a matrix card which is insertable into a particular card location and includes arrays of pin contacts extending from both surfaces thereof joined to discrete circuits thereof. The pin contacts enable interconnection to others thereof by jumper wires defining a circuit integration system, and enable customizing or programming the particular junction box to serve a particular purpose in a manner permitting and facilitating reprogramming later if desired. Such a matrix card can include daughter card connectors along the rear edge on both surfaces thereof for connection of their contacts to circuits along both major surfaces thereof. With no electronic components thereon and thus minimal heat generation, no metal layer is needed on a major surface of the matrix card for heat dissipation to the front junction box panel.

It is an objective of the present invention to provide a junction box adapted to enclose an electrical interconnection of daughter card circuits to input/output conductors, while providing protection of the interconnections from electromagnetic and radiofrequency energy to assure the integrity of the signals transmitted across the interconnections.

It is also an objective for such a junction box to be rugged, compact and light in weight.

It is an additional objective to provide such a junction box which is adapted to dissipate thermal energy from the interior of the junction box generated by the daughter card components and the interconnections with conductors contained therein.

It is a further objective to provide such a junction box which enables access thereinto for removal and replacement of a particular daughter card without requiring removal of the junction box from its in-service position, and without otherwise necessitating disconnecting any remaining connections between other daughter cards and associated input/output conductors, greatly minimizing down time of an aircraft in which the junction box is mounted by rendering moot the necessity for retesting of the circuits and functions of the daughter cards not disconnected.

An embodiment of the present invention will now be disclosed by way of example with reference to the accompanying drawings.

BRIEF DESCRIPTION OF THE DRAWINGS

FIGS. 3 and 4 are an isometric view of a spring clip for establishing thermal junctions of daughter cards with the junction box, and a plan view of a blank for the spring clip;

FIGS. 5 and 6 are enlarged part section views of the thermal junction of a daughter card and the junction box, being assembled and fully defined, respectively;

FIG. 7 is an enlarged part section view of a fastener for use in securing the front panel to the junction box of FIGS. 1 and 2;

FIGS. 8 and 9 are isometric views of the rack assembly of FIG. 1, assembled and exploded respectively, showing the cable connectors mounted therein at the input/output interface of the junction box and the rack assembly;

DETAILED DESCRIPTION OF THE PREFERRED EMBODIMENT

Figure 1:
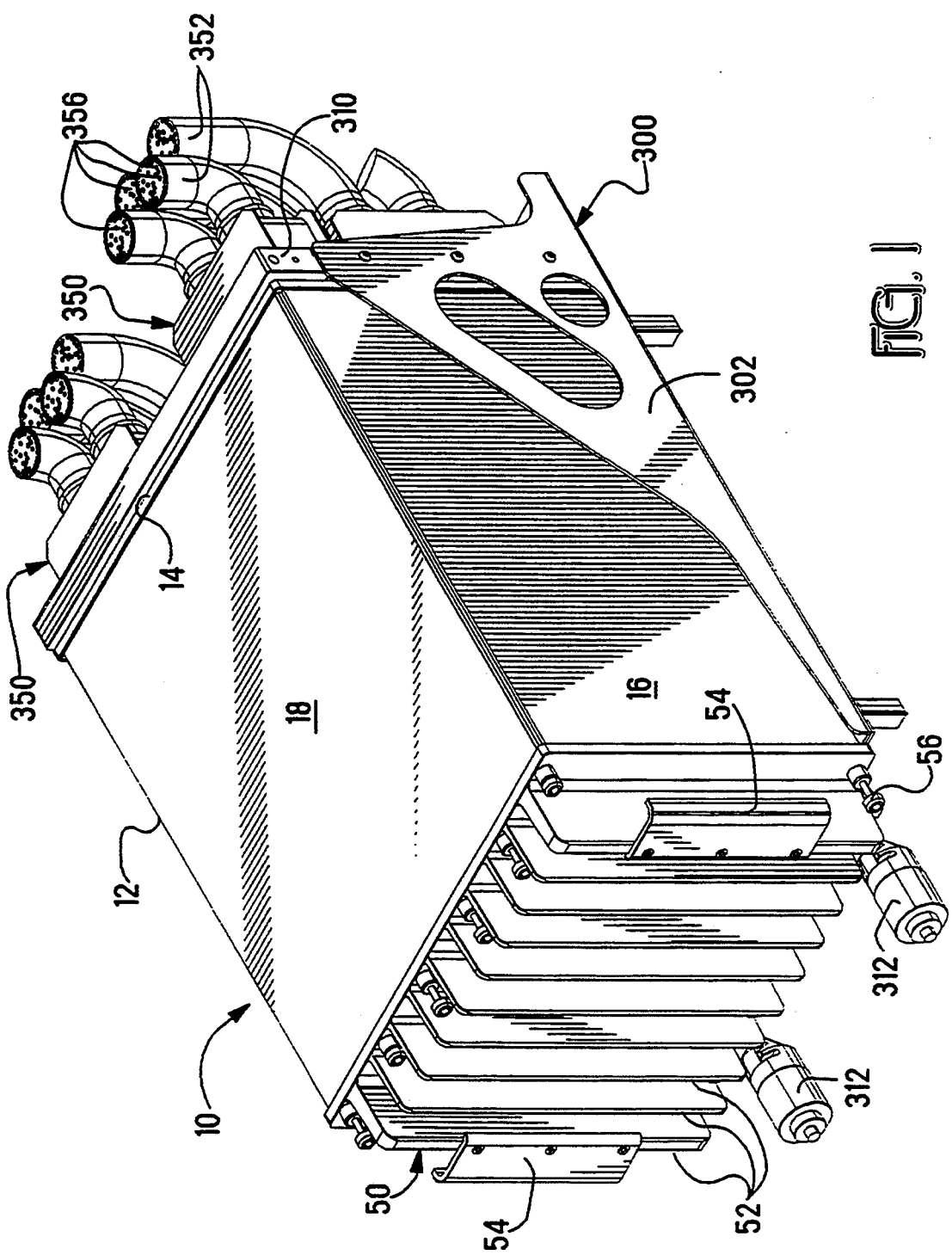
FIG. 1 is an isometric view of the junction box of the present invention secured in position within a rack assembly.
Figure 2:
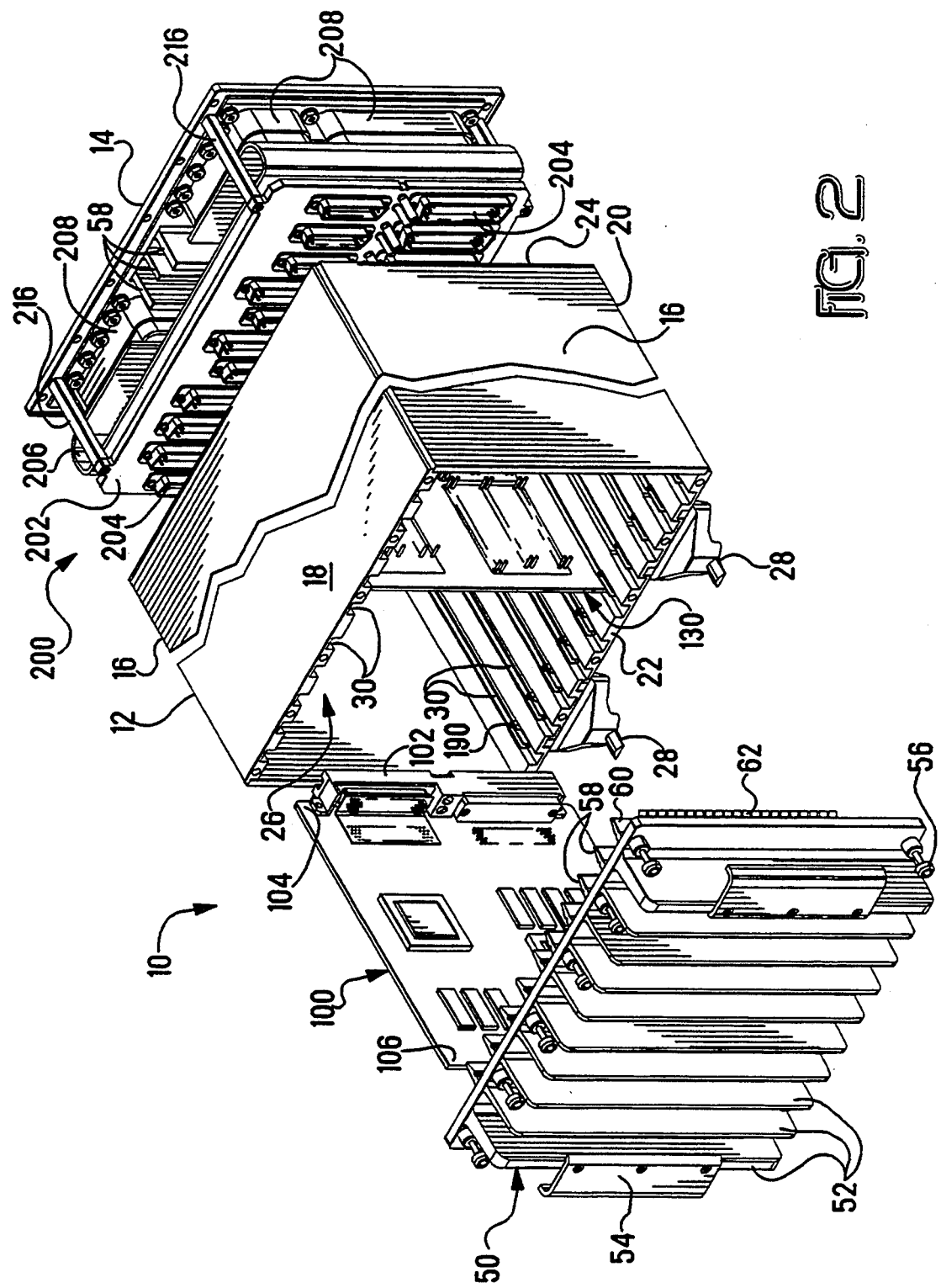
FIG. 2 is an exploded isometric view of the junction box of FIG. 1.
Figure 10:
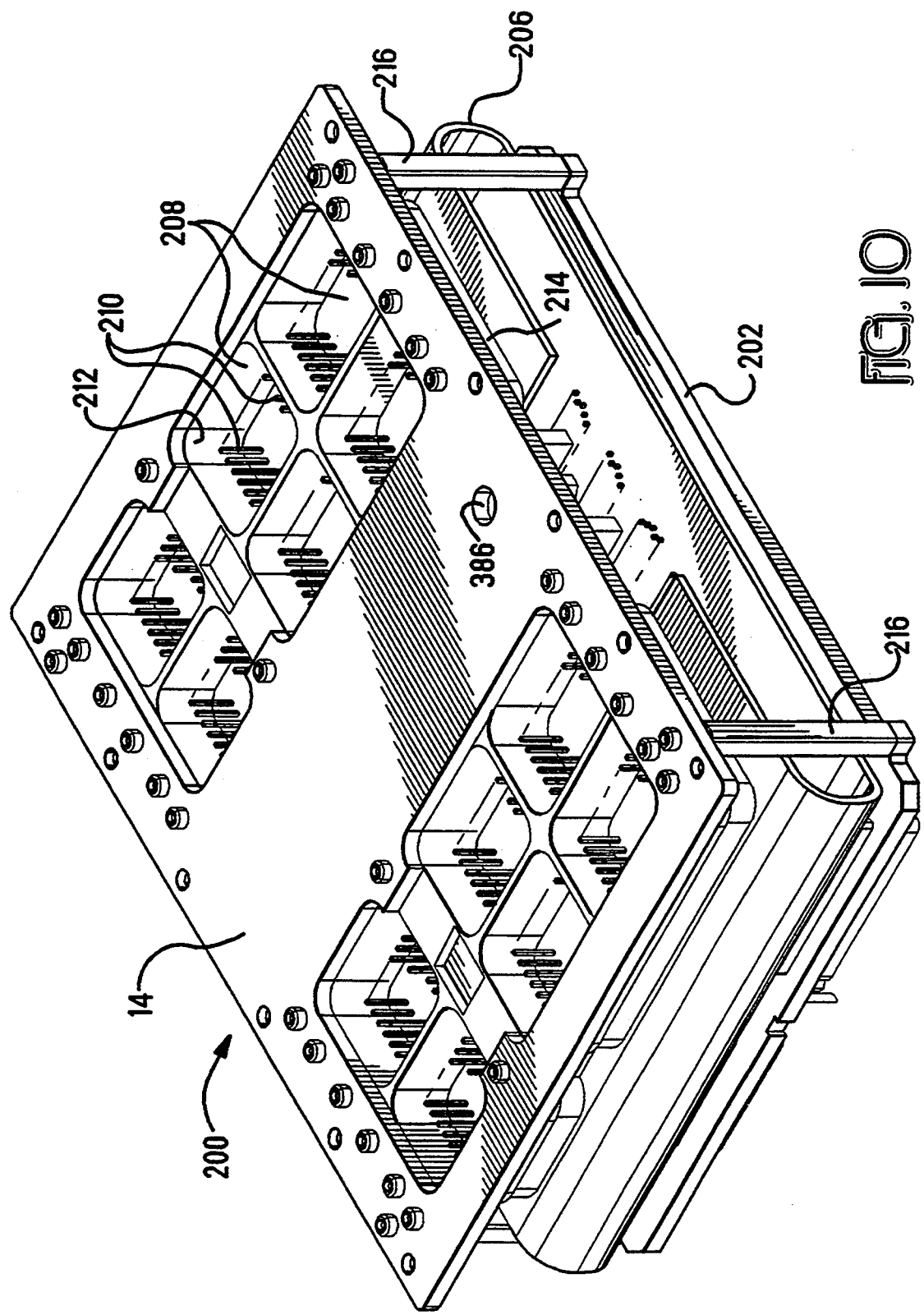
FIG. 10 is an isometric view of the rear wall of the junction box, which is part of the backplane assembly for the junction box, showing the input/output connectors thereof at the input/output interface.
Figures 13, 14:
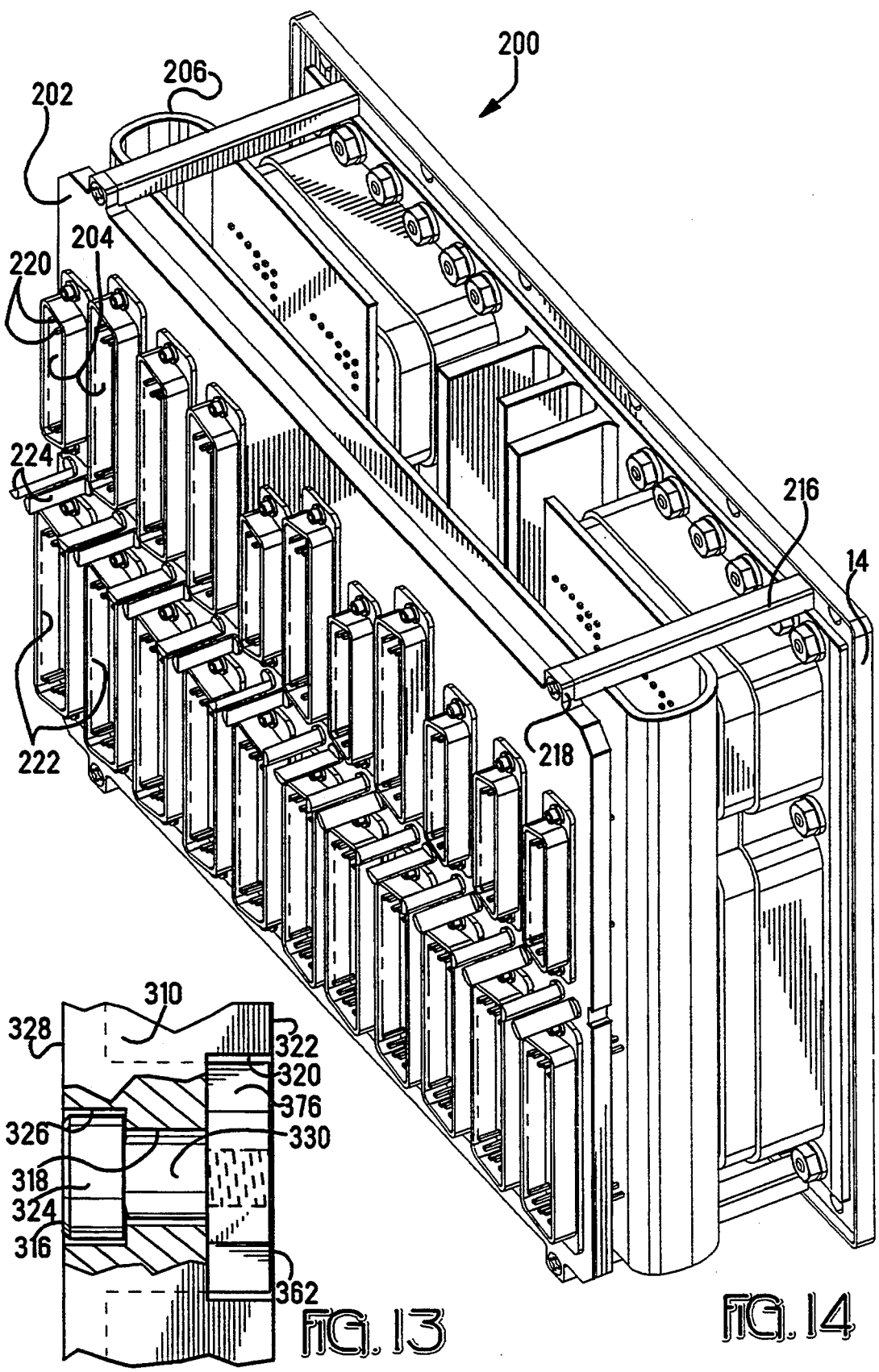
FIG. 13 is an enlarged section view of a float mount fastening arrangement of a cable connector in the frame of the rack assembly of FIGS. 8 to 12.
FIG. 14 is an isometric view of the backplane assembly showing the daughter card interface thereof within the junction box.

Junction box 10 of FIGS. 1 and 2 includes a box-like body section 12, front panel 50 and rear wall 14 with body section 12 having opposing side walls 16 and top wall 18 and bottom wall 20 and extends from front face 22 to rear face 24 defining a card-receiving region 26 extending inwardly from front face 22. Front panel 50 includes an array of exterior fins 52, to two of which are mounted a pair of handles 54 enabling manual gripping of the front panel for handling during removal from junction box 10, and is mountable to front face 22 using fasteners 56 secured about the periphery threaded into apertures of forward edges of the top and bottom walls 18,20. Junction box 10 is preferably used in conjunction with a rack assembly 300 such as is shown in FIGS. 8 and 9 to which are secured cable-terminated connectors 350, with junction box including a backplane assembly 200 such as shown in FIGS. 10 and 14 for interconnecting the cable's conductors with circuits of an array of daughter cards 100 in the junction box.

In FIG. 1 junction box 10 is shown in position mounted within tray section 302 of rack assembly 300 for in-service use, with rack assembly 300 mounted on a shelf (not shown) within a structure such as an aircraft or ship. Referring to FIGS. 1 and 8, junction box 10 is slidable along a box-receiving path 304 defined by bottom wall 306 and side walls 308, and is shown abutting panel member 310 traversing the end of box-receiving path 304. Panel member 310 is a rugged frame firmly affixed to tray section 302, and includes mounted thereto several electrical connectors 350 terminating a plurality of cables 352 containing multiple electrical conductors 356. Junction box 10 is locked in position using locking hardware 312 at the forward end of tray section 302, engaging locking embossments 28 depending from junction box 10 proximate front face 22 (see FIG. 2).

Junction box 10 is shown in greater detail in FIG. 2, with card-receiving region 26 including opposing pairs of card guide channels 30 extending inwardly from front face 22 to define guides for insertion of circuit cards such as daughter card 100 and matrix card 130. Thus junction box 10 is essentially a compact, fully enclosed card cage. Backplane assembly 200 is provided proximate rear face 24 and includes a forward wall section 202 traversing the inwardmost extent of card-receiving region 26. Mounted onto forward wall section 202 is an array of card-associated electrical connectors 204 matable with complementary connectors 102 affixed to leading edges 104,134 of daughter cards 100 and matrix card 130 (see FIG. 19). Backplane assembly 200 further includes interconnection circuitry 206 extending from forward wall section 202 to rearward wall section 14, which may comprise the rear wall of junction box 10 as shown if desired. Rear wall 14 includes mounted thereon an array of electrical input/output connectors 208 corresponding to connectors 350 mounted on frame member 310 of rack assembly 300 (FIG. 8). Preferably rear wall 14 is joined to forward wall section 202 by a plurality of struts 216 peripherally of interconnection circuitry 206, so that backplane assembly 200 is manipulatable as a unit or subassembly insertable into body section 12 of junction box 10 at rear face 24 whereafter rear wall 14 is fastenable to rear edges of side walls 16 and top and bottom walls 18,20 thereof.

Junction box 10 defines an integral rugged electrically conductive envelope surrounding the backplane assembly and daughter cards which provides protection against electromagnetic and radiofrequency interference to assure the integrity of signals received, processed and transmitted by the electronic circuitry and components therewithin. The junction box also provides heat dissipation for the components and interconnections therewithin which have become isolated from the otherwise cooling effect of ambient air flow usually relied upon to remove thermal energy from electronics bays. Side walls 16, top and bottom walls 18,20, rear wall 14 and front panel 50 are preferably formed of an electrically conductive alloy with superior thermal conductivity such as aluminum Alloy No. 6061 suitable for welding. Further preferably, all seams between the wall members of the junction box are tight fitting such as by being welded or even extruded integrally, or with resilient conductive EMI gaskets used where necessary such as the mounting interface of the front panel with the front face, and at the openings or cutouts 228 in rear wall 14 for input/output connectors 208 (gaskets 229 of FIG.17), thus eliminating all gaps which otherwise could permit EMI/RFI leakage into and out of the junction box. Such gaskets could be of conductive elastomer sold as CHO-SEAL 1285 by Chromerics, Inc.

The junction box thus provides a compact card cage of robust construction adapted to shield circuit cards and interconnections of circuits thereof with input/output conductors. With use of matrix card 130 (FIG. 19) or similar element the junction box has a circuit integration capability enabling simplification of the backplane assembly to become compact for a high population of circuit interconnections.

Embossments 28 are seen (FIG. 2) depending from bottom wall 20 at the front edge thereof, and are designed to be engaged by locking hardware 312 (FIGS. 1 and 8) of rack assembly 300 when junction box 10 is inserted fully into rack assembly 300. By being affixed to bottom wall 20, locking hardware 312 and embossments 28 continue holding junction box 10 in its locked in-service position mated to panel member 310 of rack assembly 300 at the input/output interface even when front panel 50 is removed from front face 22; the arrangement permits opening the junction box for insertion or removal of a particular daughter card while permitting all other daughter cards to remain in position with their circuits fully connected through the backplane assembly to the input/output conductors at the input/output interface at rear wall 14 and panel member 310 of rack assembly 300. Such capability greatly minimizes down time of an aircraft in which the junction box is mounted by rendering moot the necessity for retesting of the circuits and functions of the daughter cards not disconnected. Locking hardware may be of the extractor holddown type disclosed in U.S. Pat. No. 3,640,141.

Further seen in FIG. 2, front panel 50 includes an array of interior fins 58 associated with respective daughter cards 100 and extending to card-proximate ends 60 on which are mounted spring clips 62. Spring clips 62 are adapted to capture trailing ends 106 of all daughter cards simultaneously upon mounting of front panel 50 in place across front face 22 in a manner permitting simultaneous disengagement, to engage trailing ends 106 at pluralities of locations to establish thermal junctions 64 therewith (FIG. 6). Thermal junctions transfer heat from the daughter cards to the interior fins, and front panel 50 dissipates the heat from the daughter cards and interior of the junction box, especially through exterior fins 52. Rear wall 14 also is shown to have interior fins 58 which likewise provide heat dissipation benefits.

In FIG. 3 is shown a spring clip 62 mountable to card-proximate ends 60 of interior fins 58 of front panel 50 of junction box 10, with spring clip 62 formed from a blank 62A as shown in FIG. 4, and with FIGS. 5 and 6 illustrating spring clip 62 mounted to a fin and establishing a thermal junction 64 with a daughter card trailing edge 106. Spring clip 62 is disclosed in greater detail in U.S. patent application Ser. No. 08/076,614 filed Jun. 11, 1993 and assigned to the assignee hereof. Such spring clips mounted along the interior fins are adapted to mate simultaneously with the front edges of all the respective daughter cards in a blind mate manner. Preferably spring clips 62 are formed of metal stock such as beryllium copper Alloy No. 25, full hard temper and be sufficiently thick to possess strong spring properties such as 0.010 inches thick.

Each spring clip 62 includes a mounting section 66, body section 68 extending therefrom, and an array of spring arms 70 extending from body section 68 to respective free ends 72. Preferably mounting section 66 is adapted to be joined to a card-remote portion of a respective fin 58, such as surface 74 facing away from the associated circuit card trailing edge 106. Mounting section 66 can comprise an array of spring arms 76 extending from bight sections 78 joined to body section 68 around fin end 60 and along card-remote surface 74 to free ends 80. Each free end 80 comprises a short section extending perpendicularly to card-remote surface 74 of fin 58 to be received into recess 82 thereof defining a locking surface 84. Mounting spring arms 76 are so formed at bight sections 78 and have free ends 80 extending to an edge 86 so positioned a short distance from body section 68 in the unstressed state compared to the thickness of interior fin 58 at recess 82, that free ends 80 are held therein by strong clamping spring bias able to resist being pulled off card-proximate fin ends 60 during front panel removal.

Body section 68 is integral and elongate to extend along most of trailing edge 106 of a daughter card 100, and extends from mounting section 66 and along a card-proximate surface 88 of fin 58 to be parallel and adjacent to a trailing edge portion 106 of daughter card 100. A spring arm section is adjoined to body section 68, such as an array of discrete spring arms 70 joined at respective bight sections 90 positioned forwardly of trailing edge 106 upon full assembly of the circuit card in the junction box and placement of front panel 50 along front face 22. Each spring arm 70 extends to a constriction 92 and concludes at a free end section 72 diverging from body section 68 at card-proximate fin end 60 and defining an edge-receiving entrance. Constriction 92 is dimensioned less than the thickness of a daughter card 100, and upon entry of the trailing card edge thereinto spring arms 70 are deflected outwardly and thereafter assuredly urge trailing edge portions 106 inwardly against body section 68 of a respective spring clip 62 at a plurality of locations along trailing edge 106 establishing an array of thermal junctions therewith.

Each elongate spring clip 62 with opposed arrays of spring arms 70,76 of such serpentine cross-section can be made using a blank 62A as shown in FIG. 4, by using for example a plurality of sets of elongate dies in a press apparatus (not shown) in a progression of forming steps and preferably a progression of such steps for particular ones of the bight sections to consistently and carefully attain the desired bight radii and resultant dimensions at constrictions 92 and mounting free ends 80 in the unstressed state.

When used with daughter cards 100 having a metal layer 110 for optimized thermal conductivity to the card's edge, the spring clips are preferably electrically conductive and serve to establish an assured ground of the metal layers to the conductive enclosure, facilitating the performance of the metal layers in minimizing crosstalk between the components of the various cards.

FIG. 7 is an enlarged section view of a fastener assembly 56 of the type especially useful in mounting front panel 50 to front face 22 of junction box 10. Such fastener assembly 56 is conventional and one example is a captive panel screw available from Amatom, Inc. under Part Nos. 6766-SS-0832 and 6254B-SS-1032. Housing 160 includes an axially extending flange 162 pressfit into a large-diameter aperture 164 into front panel 50. Tool-engageable head 166 of screw member 168 is exposed outwardly of housing 160; elongate small diameter shank 170 extends through cavity 172 of housing 160 to large diameter threaded end portion 174 threadable into correspondingly threaded aperture 176 in forward edges of top and bottom walls 18,20 of body section 12 of junction box 10. Upon screw member 168 being rotated to unthread end portion 174 from aperture 176, larger-diameter threaded end portion 174 is received into housing cavity 172 which maintains it captive in the fully unthreaded state. With such fasteners, no loose parts exist needing to be specially handled especially during rethreading, or possibly to become misplaced during the process of removing and replacing front panel 50 from front face 22 of junction box 10.

Rack assembly 300 is shown in FIGS. 8 and 9, and is of the type disclosed in U.S. patent application Ser. No. 08/076,655 filed Jun. 11, 1993 and assigned to the assignee hereof. Bottom wall 306 and side walls 308 define a box-receiving path 304 extending to frame member 310, so that cable connectors 350 mounted thereon are positioned to become mated with corresponding input-/output connectors 208 (FIG. 11) of the rear wall of the junction box when junction box 10 is fully installed by being moved along box-receiving path 304. The arrangement permits all cables 352 to be installed as complete cable harnesses into an aircraft (along with rack assembly 300) separate in time from installation of the junction box, and permitting automatic mating of the connectors merely upon junction box being installed.

Figure 11:
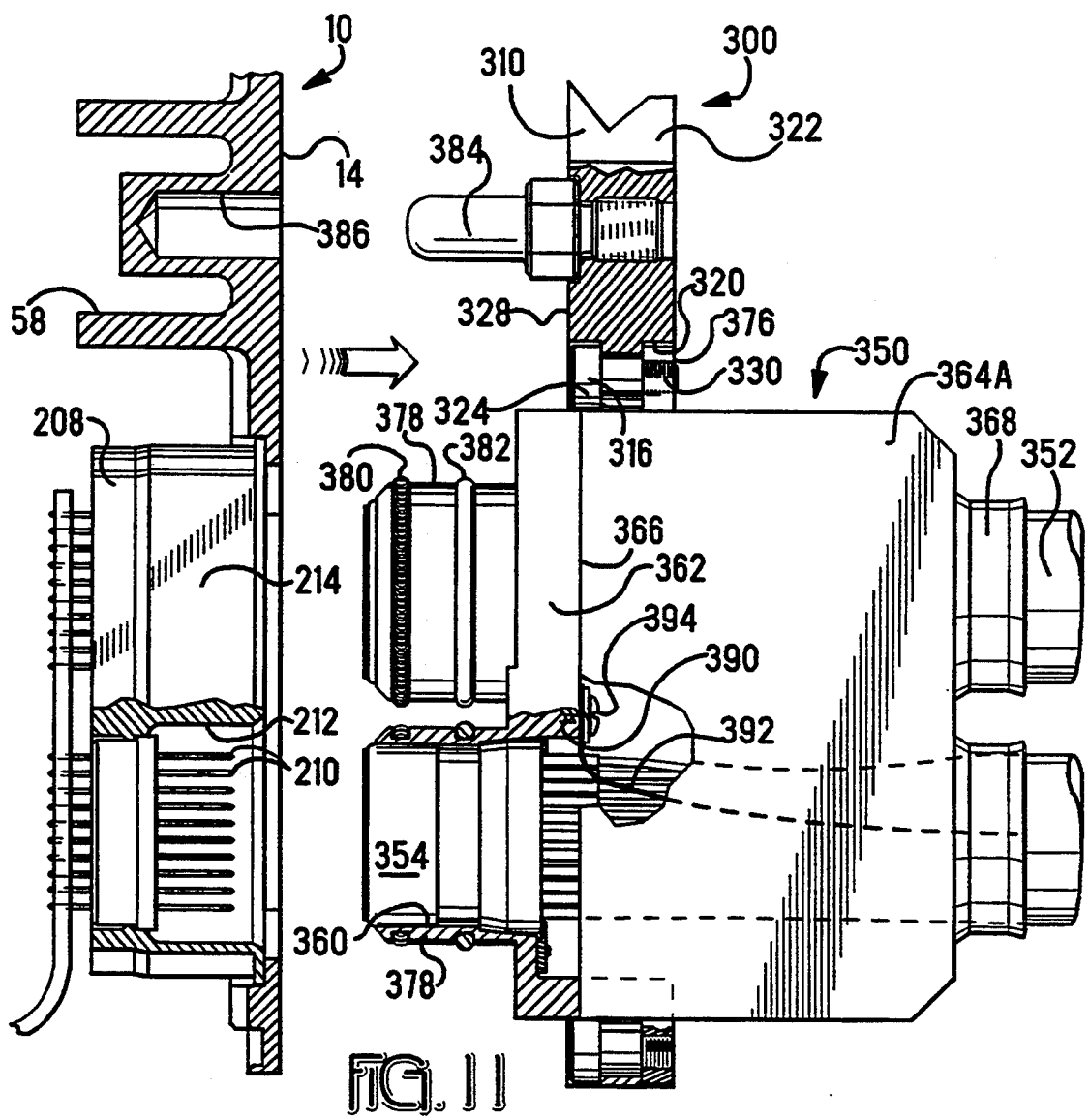
FIGS. 11 and 12 are part plan views and elevation views in cross-section of the input/output interface between the junction box and rack assembly of FIGS. 1 to 10.
Figure 12:
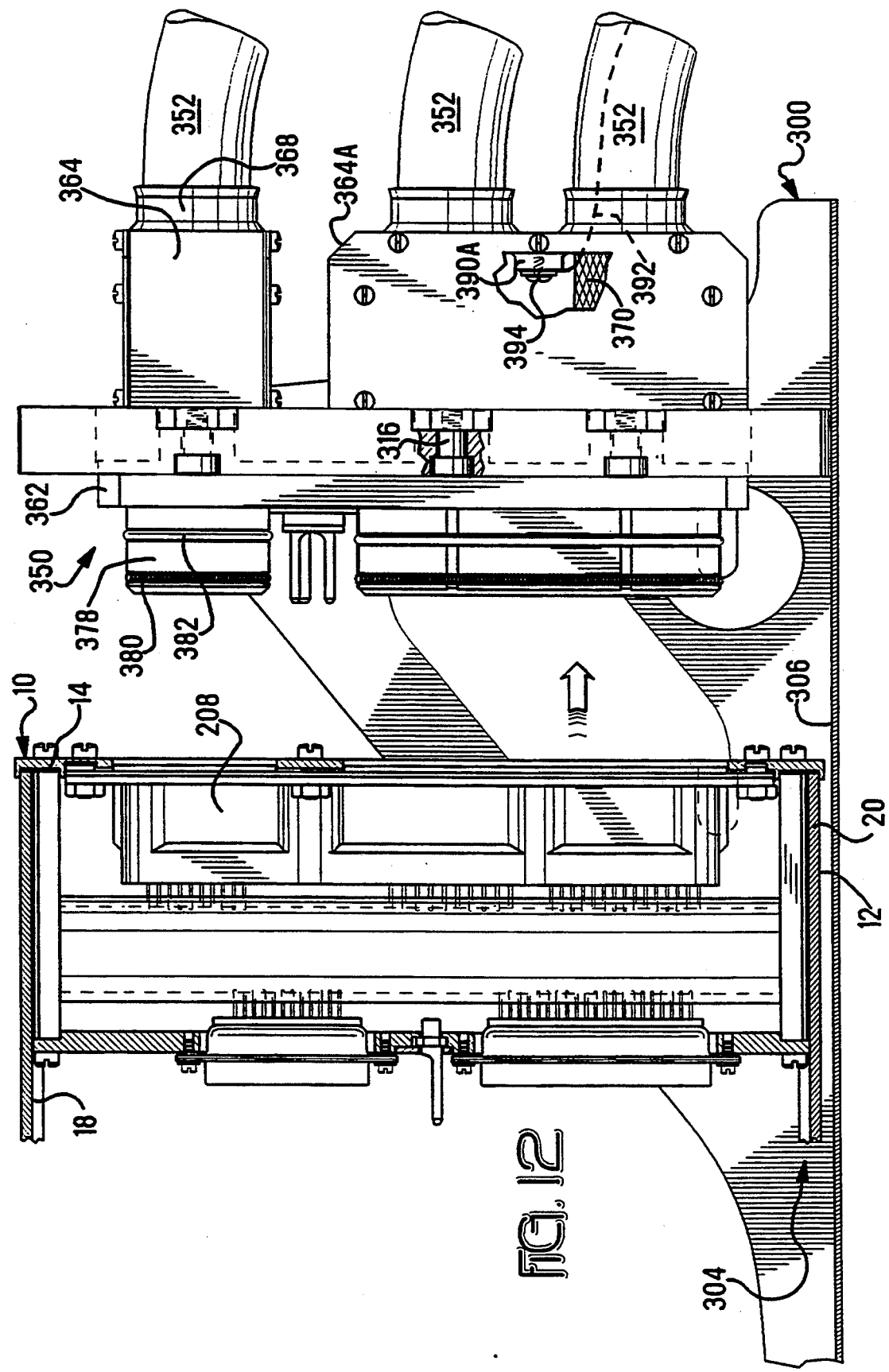

Rear wall 14 of junction box 10 shown in FIG. 10, which is shown to be a portion of backplane assembly 200, to contain an array of input/output connectors 208 mounted therealong, simultaneously matable with cable connectors 350 on frame member 310, as illustrated in FIGS. 11 and 12. Cable connectors 350 include dielectric housings 354 containing discrete terminals terminated to conductors 356 of the cables with contact sections 358 exposed at mating faces thereof. Dielectric housings 354 are secured within cavities 360 of multiconnector shell members 362, and backshells 364 are affixed to rearward faces 366 of the shell members 362 to enclose lengths of discrete conductor wires 356 extending from each cable 352 for EMI/RFI protection, and include integral flanges 368 to which the shielding braids 370 of each cable 352 are affixed for grounding thereof; and the backshells 364 may be clamped to the cable outer insulative jackets 372 to provide strain relief for the cable connectors 350, if desired. A representative resilient conductive EMI gasket 374 is shown in FIG. 9 disposed between backshells 364 and shell members 362 peripherally about the cavities and along the mounting interface eliminating any gap which otherwise could permit EMI/RFI leakage therethrough to eventually pass along the conductors and into the junction box. Also, connectors 350 are shown to include a means for terminating drain wires of cables 352, such as an embossment 390 of shell 362 in FIG. 11 to which a drain wire 392 is connected by a screw 394, or an embossment 390A on the back wall of a backshell 364A by a screw 394 in FIG. 12.

Referring to FIG. 9, each shell member 362 is mountable within a cutout 314 of the panel member 310 or frame, using fasteners 316 which extend through recesses 318 about the cutout 314 and through apertures through mounting ears 376 of shell member 362. Mounting ears 376 are received into corresponding recesses 320 along cable face 322 of frame 310, and heads 324 of fasteners 316 are received into recesses 326 permitting the fastener heads to be disposed below the forward surface 328 of frame 310, clear of interfering with abutting engagement of frame 310 and junction box rear wall 14.

With reference especially to FIG. 13, shell members 362 each include a peripheral flange extending through the corresponding cutout 314 and are dimensioned slightly smaller than the cutout; the mounting ears 376 are also slightly smaller than the recesses 320 of frame 310 into which they are received; and shanks 330 of fasteners 316 are slightly smaller than recesses 326 of the frame through which they extend. This arrangement permits the shell members to float within cutouts 314 of frame 310, enabling incremental transverse adjustment of the cable connectors 350 during blind mating with corresponding connectors along rear wall 14 of junction box 10 in order to precisely align the contact sections 358 of the terminals of the cable connectors with opposed contact sections 210 (FIG. 11) of mating terminals of the connectors of the junction box. Initial engagement to incur the adjustment is established by leading edges of shrouds 378 surrounding mating faces of respective housings 354 which are received as plug sections into receptacle sections 212 of shells 214 surrounding mating faces of mating connectors 208. Circumferential EMI spring strips 380 will establish an assured ground connection between shrouds 378 and receptacle sections 212 upon mating; an O-ring 382 is shown about each shroud 378 also to assist in sealing the interface if desired.

Also seen in FIGS. 8 to 10 is post member 384 affixed to frame 310 and extending forwardly into the input-/output interface to be received into a complementary post-receiving hole 386 into rear wall 14 of junction box 10 upon installation of junction box 10 in rack assembly 300. Post member 384 within hole 386 serves to maintain the position of junction box 10 within rack assembly 300 after installation to absorb stresses resulting from vibration of an aircraft which otherwise could stress the mated connectors and their mated terminals during in-service use and possibly even lead to intolerable momentary signal discontinuity; the post member also provides wear resistance benefits.

Figure 15:
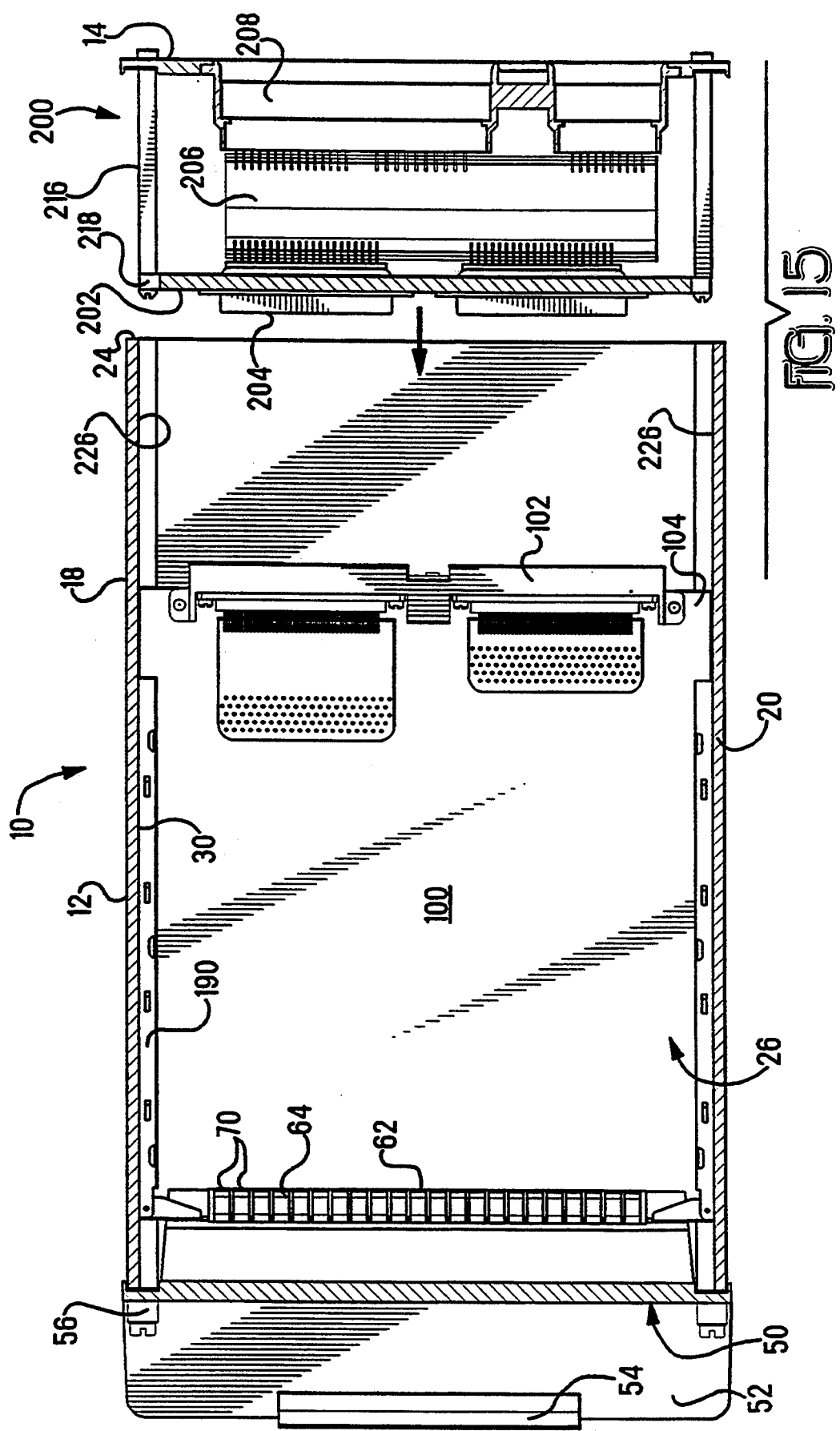
FIG. 15 is a longitudinal section view illustrating the mounting of the backplane assembly of FIGS. 10 and 14 into the junction box of FIGS. 1 and 2 which contains a daughter card positioned therewithin, and the front panel secured in place at the front face of the junction box.

Backplane assembly 200 for junction box 10 is illustrated more clearly in FIGS. 10, 14 and 15 and is disclosed in U.S. patent application Ser. No. 08/076,656 filed Jun. 11, 1993 and assigned to the assignee hereof. Strut members 216 extend between upper and lower edges of rearward wall section 14 and bosses 218 along upper and lower edges of forward wall section 202, thus securing forward and rearward wall sections 202,14 together. Interconnection circuitry 206 is disposed therebetween. A first connection region is defined which provides connections between circuits of the interconnection circuitry with terminals 220 of card-associated connectors 204 mounted in forward wall section 202, which mate with corresponding terminals of connectors 102, 132 mounted on leading edges 104, 134 of daughter cards 100 and matrix card 130 (see FIGS. 2 and 19). A second connection region is defined along rearward wall section 14 which provides connections between circuits with terminals 210 of input/output connectors 208 mounted in rearward wall section 14, which mate with corresponding terminals of cable connectors 350 mounted on panel member 310 of rack assembly 300 at the input/output interface (see FIG. 9).

Figure 16:
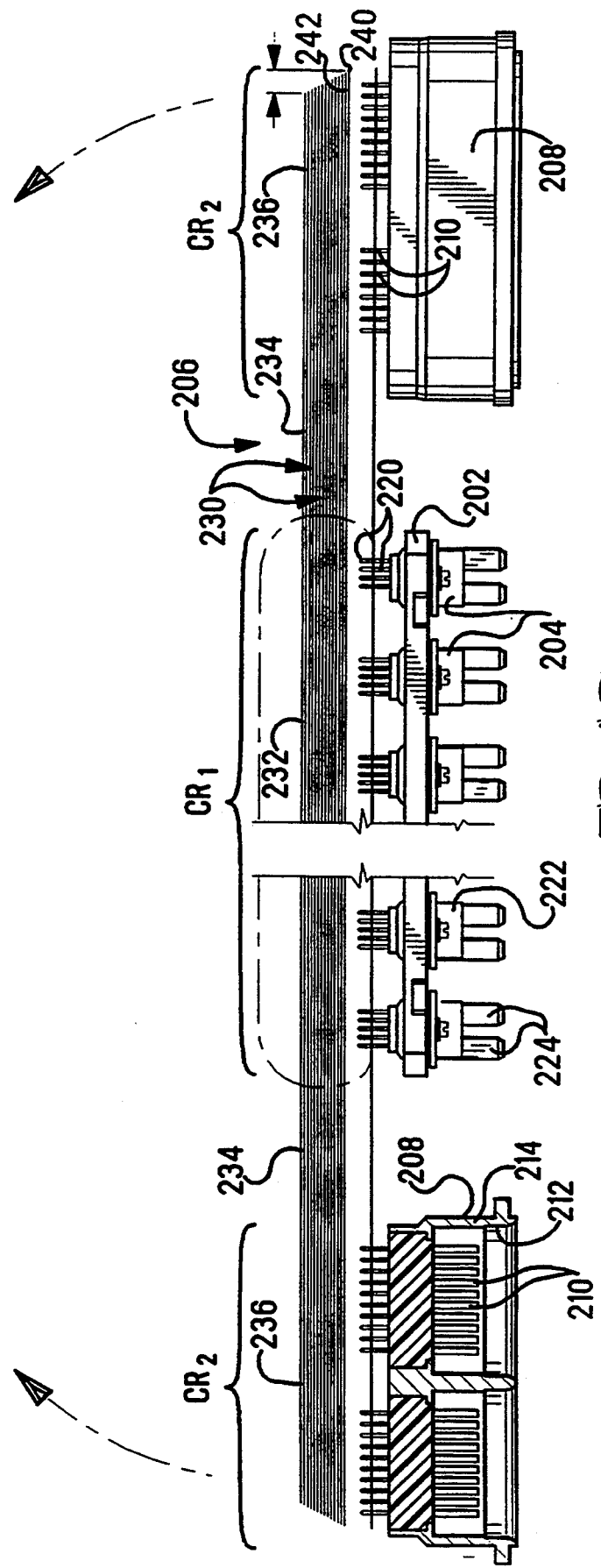
FIGS. 16 to 18 are diagrammatic illustrations of a method of constructing the backplane assembly of FIGS. 10, 14 and 15, showing discrete flexible circuit elements being sequentially assembled to the connector terminal arrays, and the forming of 180° bends in the elements resulting in the interconnection circuitry of the backplane assembly, with the rear wall being secured thereto in FIG. 18.
Figure 17:
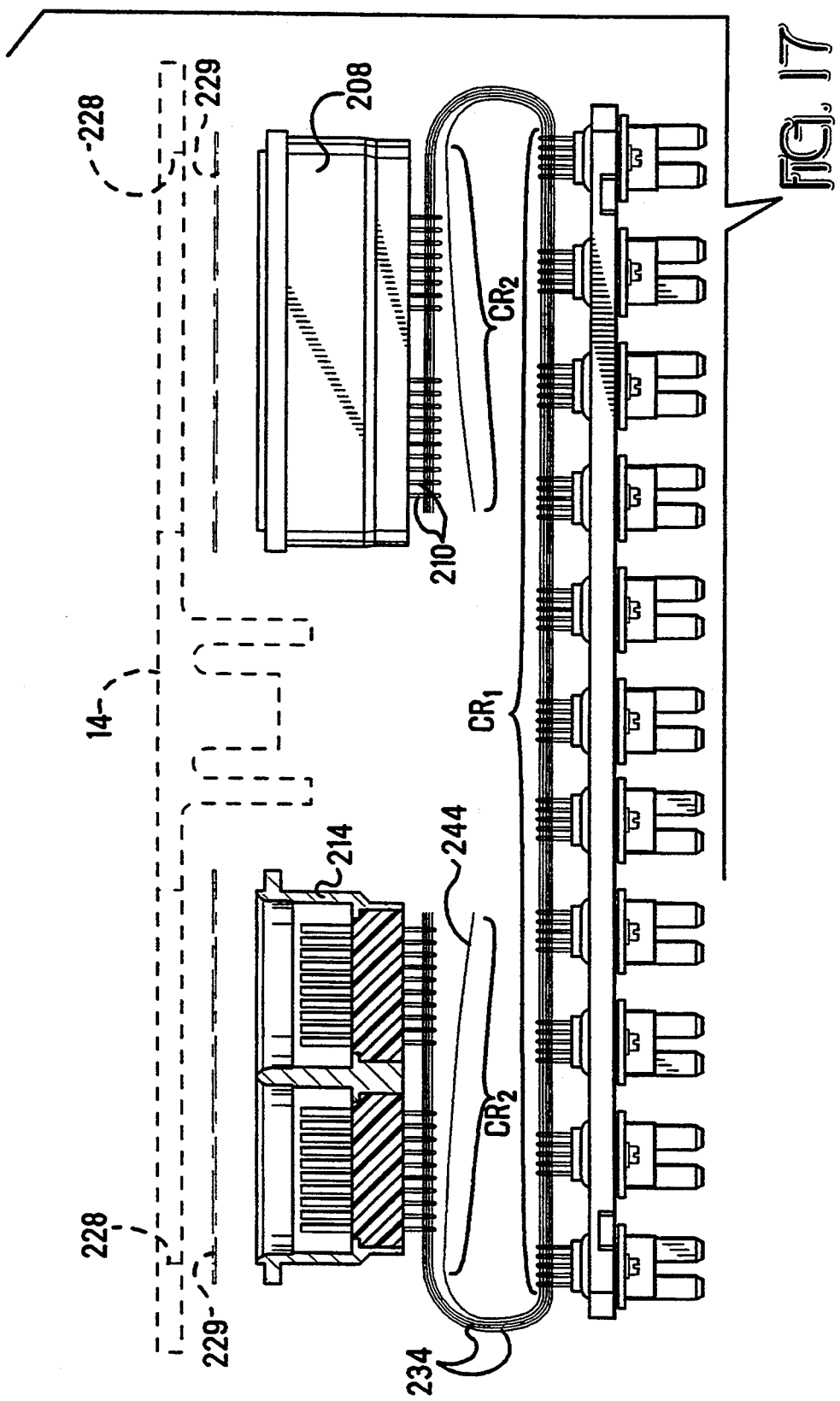
Figure 18:
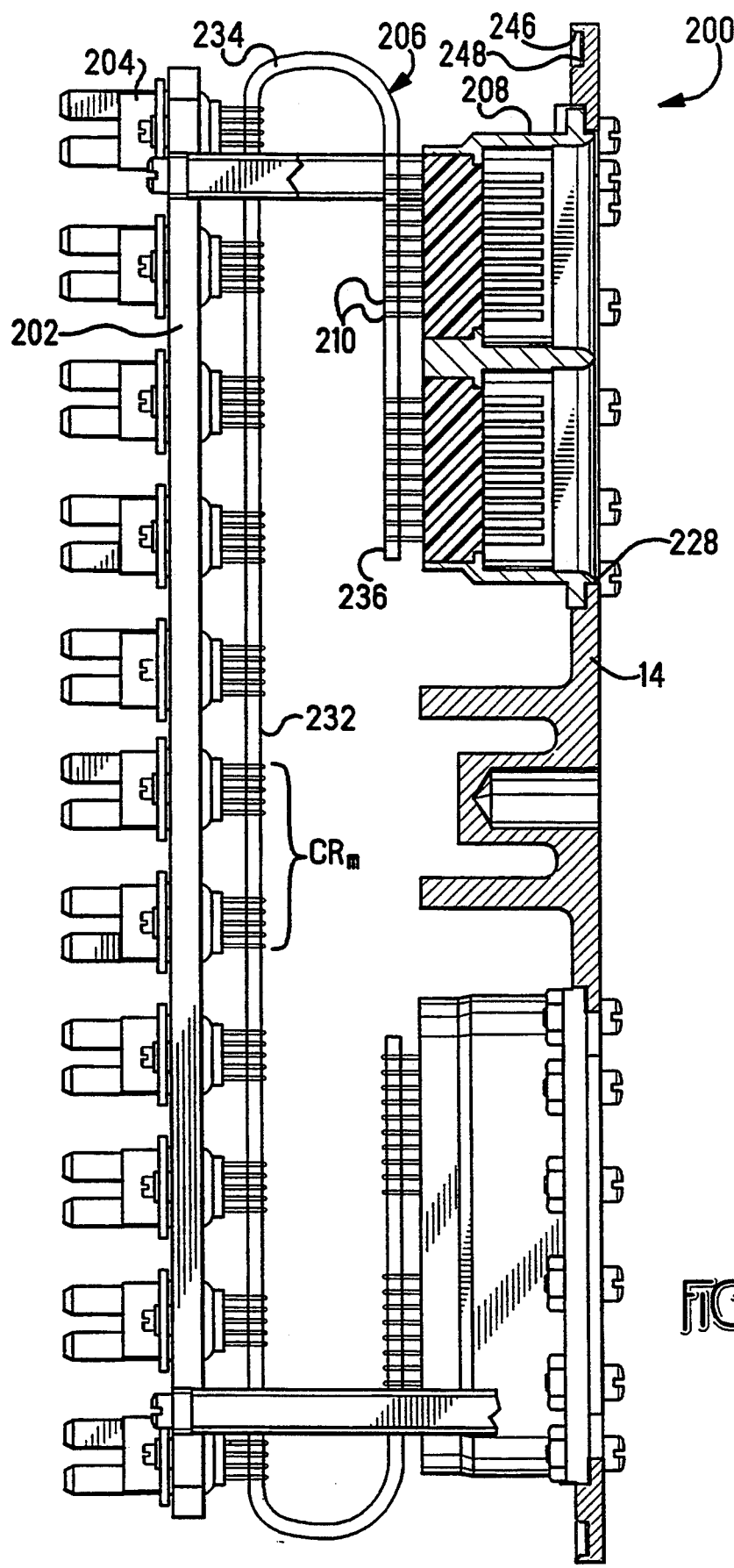

Preferably interconnection circuitry 206 is a plurality of thin film flexible circuit elements 230 overlaid to form a laminar package, as seen in FIGS. 16 to 18. The flexible circuit elements each include defined thereon certain circuits to extend from a first connection region preferably positioned in the central portion 232 of an elongate film, across intermediate film portions 234 laterally of the first connection region, to opposed end portions 236 of the elongate film, with the opposed ends together defining the second connection region. It is seen that the plurality of flexible circuit elements 230 extend through bends of 180° at the overlaid intermediate regions to each side of the backplane assembly which are within the outer envelope of the edges of the forward and rearward wall sections 202,14 to fit within body section 12 of junction box 10.

Input/output connectors 208 are disposed within shroud sections 212, which are shown to be sections of shell members 214 securable to rearward wall section 14 by an array of fasteners extending through aligned apertures of a mounting flange of shell member 214 and rearward wall section 14. Discrete shroud members 222 are seen (FIG. 14) fastened to forward wall section 202 to surround and protect arrays of pin contact sections of terminals 220 of card-associated connectors 204. Connector housings of connectors 204 are extended through associated cutouts of forward wall section 202 which are incrementally larger than the housings, permitting incremental transverse movement to enable precision alignment of the pin contact sections of terminals 220 with complementary socket contact sections of terminals of connectors 102, 132 mounted on leading edges 104, 134 of daughter cards 100 and matrix card 130 (see FIG. 15).

A pair of key members 224 is seen to extend forwardly of forward wall section 202 between each pair of connectors 204 associated with each daughter card 100, for engagement with complementary key members of the daughter card connectors 102 which enables mating of the desired daughter card with the connectors at that location. Only when the associated key members at a particular daughter card location are intentionally physically positioned to be oriented to complement each other, do the card-mounted connectors 102 and the wall-mounted connectors 204 mate; otherwise such key members abut prior to connector mating because the key members are not oriented to complement each other, preventing mating of an undesired daughter card at that card location.

With reference now to FIG. 15, backplane assembly 200 is shown positioned to be inserted into rear face 24 of junction box 10. Forward wall section 202 is dimensioned and shaped so that the peripheral edge thereof just fits within the inner surfaces of top and bottom walls 18,20 (and opposed side walls 16) of body section 12. Rearward wall section 14 is shaped and dimensioned so that its periphery abuts the rear edges of the four sides of body section 12, for fasteners to secure it to the rear face 24 of the junction box 10. Struts 216 extend between the periphery of rearward wall section 14 and the tabs 218 of forward wall section 202, are received into pairs of channels 226 in top and bottom walls 18,20 of the junction box 10 extending inwardly from rear face 24, which positions forward wall section 202 laterally for connectors 204 mounted thereto to be aligned with card guides 30 of the card-receiving region 26 forwardly thereof, all so that the wall-mounted connectors 204 are aligned with card-mounted connectors 102, 132 upon insertion of the associated daughter card or matrix card.

FIGS. 16 to 18 are diagrams illustrative of the process of assembling flexible circuit elements 230 to define backplane assembly 200. In FIG. 16 a first element 240 is shown disposed above forward wall section 202 in which connectors 204 are mounted, with pin contact sections of terminals 220 extending upwardly in arrays, all in the first connecting region $CR_1$ of the element. Laterally of the first connecting region are input/output connectors 208 initially arranged coplanar with connectors 204, likewise with pin contact sections of their terminals 210 extending upwardly in arrays, together both input/output connector terminal arrays comprising second connecting region $CR_2$. Pin-receiving holes extend through first element 240 to receive all terminals therethrough in regions $CR_1$ and $CR_2$. First element 240 includes selected circuits defined thereon, each having a terminus adjoining the pin-receiving hole at each terminal for which the particular circuit is intended to connect between regions $CR_1$ and $CR_2$, and the terminals at those termini may now be soldered. Thereafter a second flexible circuit element 242 may now be positioned to overlie first element 240, and again having a complete array of pin-receiving holes through its connection regions $CR_1$ and $CR_2$, and the termini of its selected circuits soldered to the terminals thereat. The steps are repeated for each successive flexible circuit element.

It is preferred that each flexible circuit element 230 be slightly less long than the immediately preceding element in forming the laminar array, and the opposed intermediate sections 234 are less in length. Thus the pair of connection sections comprising second region $CR_2$ of the second element 242 are staggered inwardly from the corresponding connecting sections of the first element 240, so that the pin-receiving hole arrays are staggered inwardly. With such arrangement the terminals 210 of connectors 208, when inserted through the pin-receiving holes of the second element 242, cause the first flexible circuit element 240 to bend slightly upwardly, initiating the bends at intermediate sections. Upon placement of the final flexible circuit element 244 in position, as in FIG. 17, the laminar assembly is formed around bends of 180° at the overlying intermediate sections 234 of the flexible circuit elements. In FIG. 18, the rearward wall section 14 is affixed by fastening thereto in corresponding cutouts 228, shell members 214 in which input/output connectors 208 are already secured, and then securing struts 216 between rearward wall section 14 and forward wall section 202. Also, rear wall 14 is seen to have a peripheral groove 246 therearound within which is preferably secured a resilient conductive EMI gasket 248 which will abut the rear edges of the side walls 16, top wall 18 and bottom wall 20 of body section 12 of junction box 10 upon assembly of rear wall 14 thereto.

An alternative method for assembling the flexible circuit elements can comprise stacking all elements together with pin-receiving holes in their first connecting regions $CR_1$ all aligned, and then clamping or joining all the elements together along the periphery of first connection region $CR_1$. Thereafter plating material is deposited along all the aligned pin-receiving holes of the first region, which makes an electrical connection only with circuits of any of the elements having termini adjoining the respective holes. Such plating may be performed similar to the process used in fabricating conventional printed circuit boards. Thereafter upon insertion of all pin contact sections of connectors through all the pin-receiving holes, the terminals are all soldered simultaneously to the plating material atop the last flexible circuit element, shown disposed along the top of the laminar array. The forming of the terminations in the second connection region may proceed as in the first described method, or may be similarly performed after the bends are formed and the end sections of all of the elements secured together with their pin-receiving holes aligned and then plated, after which the terminals of connectors may be soldered to the plating material.

Figure 19:
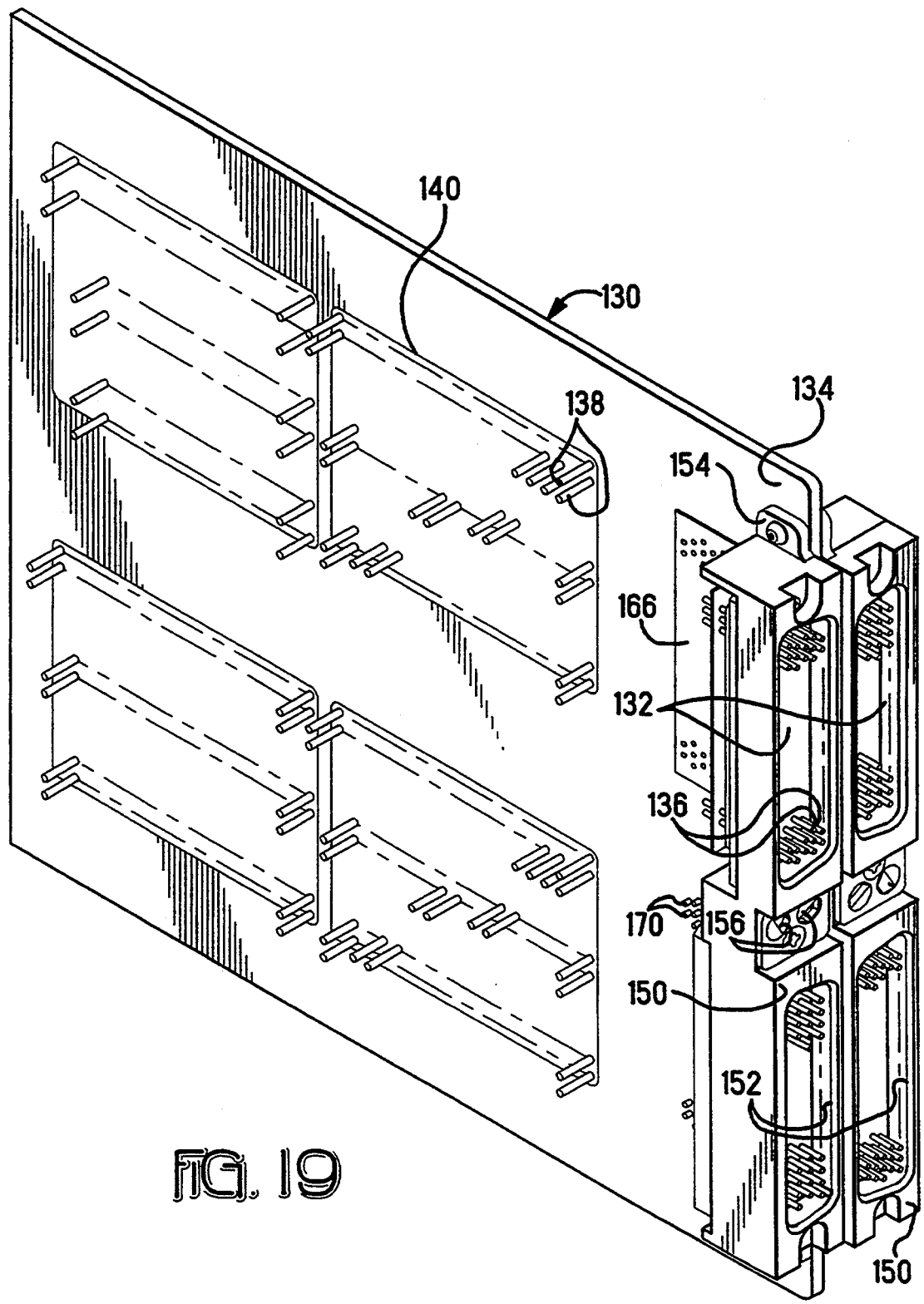
FIG. 19 is an isometric view of a matrix card for use with the backplane assembly of the junction box to integrate the circuits, and showing a pair of integral shell members containing the card-mounted connectors.
Figure 20:
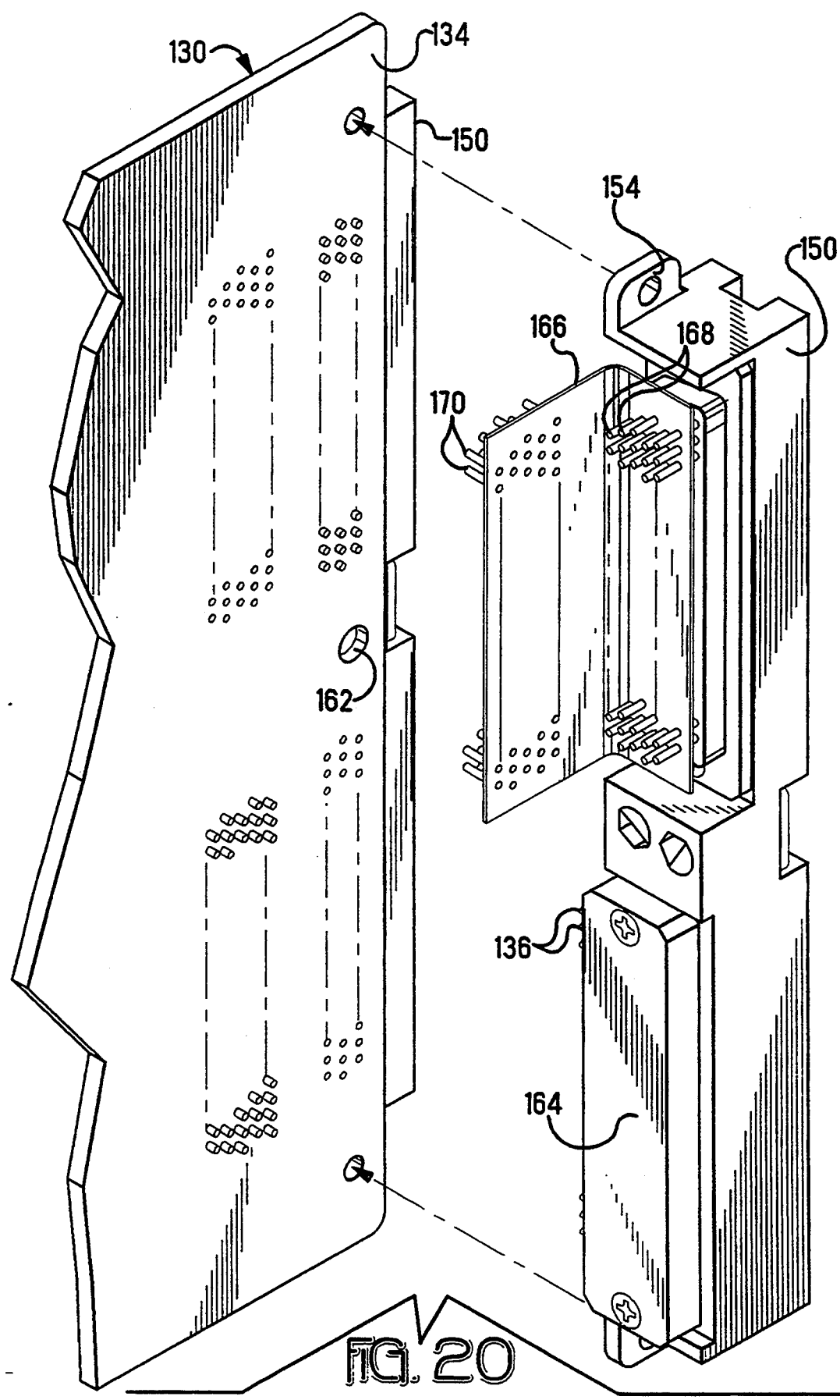
FIG. 20 illustrates an integral shell of FIG. 19 being applied to a leading edge of the matrix card.
Figure 21:
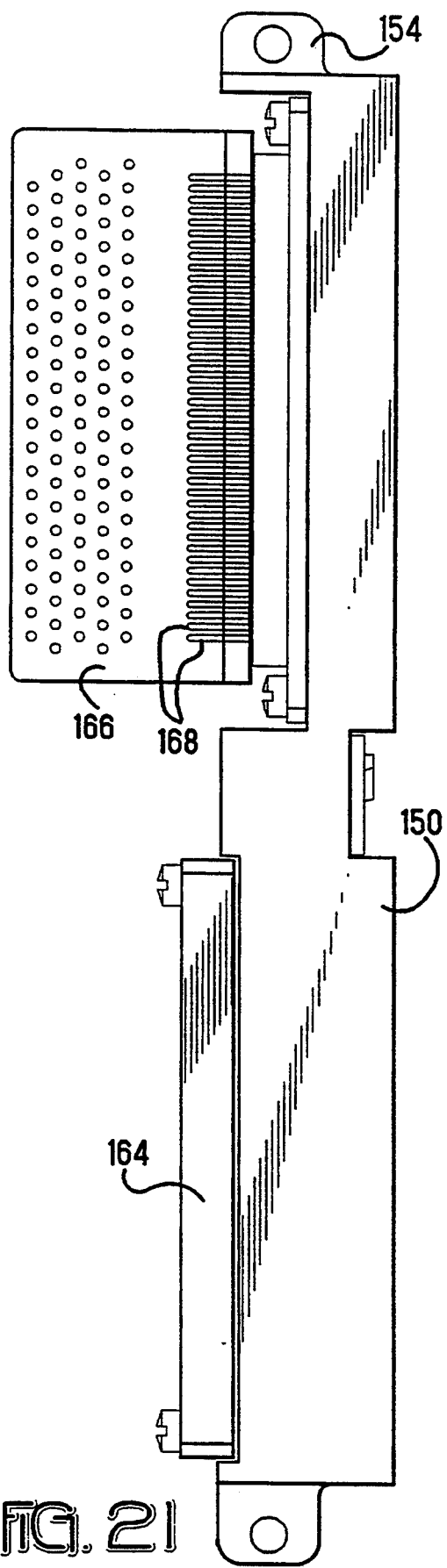
FIGS. 21 and 22 are top and elevation views of the integral shell of FIGS. 19 and 20 containing card connectors therein, with terminal arrays for termination to circuits of the card.
Figure 22:
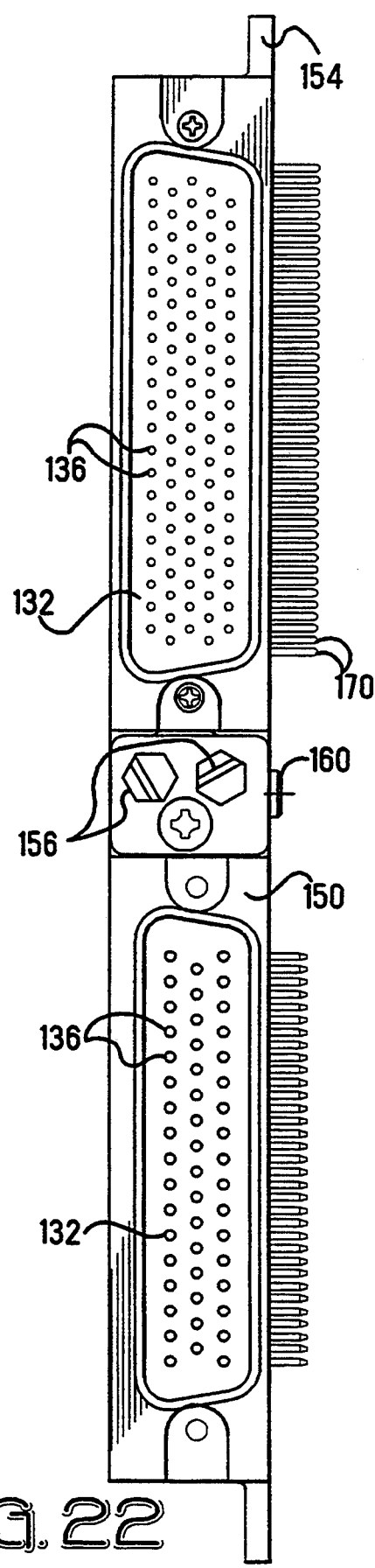

The junction box 10 of the present invention, and the backplane assembly 200 used therewith, also are especially useful to define a wire integration system, in which circuits of the daughter cards 100 can be connected as desired to any particular conductor of the input/output interface. Matrix card 130 is disclosed to be insertable into the junction box in the same manner as a daughter card at a particular location, preferably having connectors 132 mounted on both sides of leading edge 134 as shown in FIG. 19. Terminals 136 of the four connectors include contact sections electrically connected to Circuits of the matrix card which extend to one or more other card terminals 138 which in turn are connected to other card terminals 138 or directly to other terminals 136 of the four connectors as desired, such as by using flexible film circuit elements 140 as shown, or alternatively by discrete wires wrapped to the card terminals 138 with conventional wire wrapping techniques. The matrix card can thus be easily programmed by utilizing flexible circuits of particular customized circuit design (or discrete wire wrap segments), which can be replaced on the matrix card if necessary.

Backplane assembly 200 accommodates the use of such a programmable circuit integration member as matrix card 130, by directing substantially all circuits of the various flexible circuit elements of the laminar array from input/output terminals 210 of second connection region $CR_2$ (FIG. 17) only to terminals in matrix connection region $CR_M$ (FIG. 17) preferably in the center of first connection region $CR_1$ with which the location of matrix card 130 would of course be aligned. From matrix connection region $CR_M$ circuit segments would extend to selected terminals of first connection region $CR_1$ associated with particular daughter cards. Thus backplane assembly 200 may be fabricated to a basic circuit configuration, with matrix card 130 providing customization for particular uses of the junction box 10, and enabling ease of reprogramming, all resulting in simplified construction of the backplane assembly which can easily handle providing circuits for over a thousand of individual terminal interconnections in a compact arrangement, as in the present design.

Referring to FIGS. 19 to 22, an integral shell member 150 is shown which contains a pair of card-mounted connectors 132 in corresponding cavities 152. Integral shell member 150 is of the type disclosed in U.S. patent application Ser. No. 08/076,616 filed Jun. 11, 1993 assigned to the assignee hereof. Integral shell 150 may be machined of aluminum Alloy No. 6061, and includes end flanges 154 enabling mounting to a circuit card by conventional mounting hardware such as bolts and nuts or a screw in a self-tapping hole of the shell, or by rivets, and includes a pair of key members 156 which complement key members 224 on forward wall section 202 of backplane assembly 200, shown in FIG. 14.

A centrally located reference post 160 (FIG. 22) depends from integral shell 150 and is received into a complementary alignment hole 162 through the leading edge 134 of the circuit card 130. Alignment hole 162 is precisely referenced to the array of circuit termini of the circuit card 130, and reference post 160 is precisely related to precision machined cavities 152 in which connectors 132 are secured. Once the arrays of card-connectable contact sections of terminals of connectors 132 are aligned with and soldered to circuit termini of the circuit card during connector mounting, the reference post maintains that reference through both terminal arrays across the mating faces of the connectors 132 in the shell cavities 152.

Card-connectable contact sections of terminals 136 may be conventional right-angle pin contacts insertable into through-holes of the card, as is conventional, and a protective plate 164 secured to the connector rearwardly of the right-angled terminals. Electrical connection may be attained by using flexible film circuit elements such as 166 having circuits whose termini are soldered to straight pin sections 168 of terminals of the connector at first ends, and termini are similarly soldered to headed pin members 170 to be inserted into through holes of the circuit card defining the array, and soldered. If desired a cover member (not shown) may be utilized to protect the extending ends of pin members.

Cavities 152 of integral shell 150 can be shaped to receive housings of various conventional designs. Shell portions peripherally surrounding the mating faces of the connectors are adapted to engage leading ends of shrouds 222 surrounding wall-mounted connectors 204 of backplane assembly 200, assuring that the arrays of mating terminals are aligned by causing the shrouds of wall-mounted connectors 204 to incrementally adjust transversely, as well as integral shell 150 causing the leading edge of the circuit card 130 to be adjusted incrementally transversely within card guides prior to actuation of card lock components 190 mounted within card guide channels 30 (see FIGS. 2 and 15). Components 190 may be thermal card guides having Part No. 25-B-14-6 sold by E G & G Birtcher Co.

Variations and modifications may occur to the junction box of the embodiment disclosed herein, which may occur to the artisan, which are within the spirit of the invention and the scope of the claims.

What is claimed is:

1. A junction box for a plurality of electrical interconnections of circuits of circuit cards with electrical conductors extending into the junction box at an input/output interface, comprising:

a body member defining opposed side walls and opposed top and bottom walls extending from a front face to a rear face, a front panel member removably secured to said front face to define a front wall traversing a card-receiving opening, and a backplane assembly removably attached to said rear face and including a transverse interior wall positioned rearwardly of a card-receiving region proximate said front panel and a rear wall, all generally defining a card cage;

said side walls and top wall and bottom wall and rear wall and front panel member being formed of thermally and electrically conductive material of substantial thickness and being substantially free of openings, said side walls and said top and bottom walls adjoined to edges of adjacent ones thereof and said rear wall being adjoined to rear edges of said opposed side walls and said top and bottom walls in a manner to eliminate any gap thereat through which electromagnetic and radiofrequency energy could otherwise pass;

said rear wall including an array of electrical input/output connectors mounted thereon adapted to be mated with complementary electrical connectors and defining an input/output interface, said rear wall including shield sections surrounding respective said input/output connectors in a manner eliminating any gap peripherally therearound through which electromagnetic and radiofrequency energy could otherwise pass, said interior wall including an array of card connectors mounted thereon to mate with corresponding connectors of a plurality of circuit cards insertable into said body member, and one of said opposing side walls or said top and bottom walls including pairs of card guide means extending from front edges thereof to said interior wall and cooperating to guide movement of respective said circuit cards during insertion and removal, with said card connectors aligned with respect to respective said pairs of card guide means to mate with complementary connectors along leading ends of respective said circuit cards during card insertion;

said backplane assembly defining an array of electrical circuits connecting terminals of said card connectors mounted on said interior wall to terminals of said input/output connectors mounted on said rear wall;

said front panel member being secured to said body member to tightly abut front edges of said opposed side walls and said top and bottom walls in a manner to eliminate any gap thereat through which electromagnetic and radiofrequency energy could otherwise pass, and securable in a manner facilitating removal thereof to permit insertion and removal of a said circuit card;

said front panel member including an array of first fins extending outwardly to facilitate dissipation of thermal energy into ambient air flow, and further including an array of second fins extending inwardly to facilitate absorption of thermal energy from said card-receiving region, whereby a compact card cage of robust construction is defined adapted to shield said circuit cards and electrical interconnections thereof with said electrical conductors from electromagnetic and radiofrequency interference and to facilitate dissipation of thermal energy therefrom.

2. A junction box as set forth in claim 1 wherein said rear wall includes at least one fin extending into said body member facilitating heat dissipation during in-service use by increasing the surface area exposed to the interior of the junction box.

3. A junction box as set forth in claim 1 wherein said second fins of said front panel member are associated with trailing edges of respective circuit cards to be adjacent thereto to be at least thermally connected thereto upon securing said front panel member to said front face of said body member.

4. A junction box as set forth in claim 1 wherein locking embossments are affixed to said bottom wall of said body member proximate said front face to facilitate locking of the junction box to a rack assembly upon engagement by locking fasteners of the rack assembly.

5. A junction box as set forth in claim 1 wherein said card guide means comprise channels into inwardly facing surfaces of said one of said opposing side walls or said top and bottom walls.

6. A junction box as set forth in claim 5 wherein said channels include secured therein clamping members actuable proximate said front face from an open position facilitating movement of a circuit card along said channels to a closed position clamping said circuit card in position fully mated with said backplane assembly.

7. A junction box as set forth in claim 1 further including a programmable circuit integration member associated with said backplane assembly and insertable into and removable from the junction box, for selectively connecting substantially all said circuits of said backplane assembly extending to said terminals of said input/output connectors with substantially all said circuits extending to said terminals of said card connectors upon being electrically connected with said backplane assembly.

8. A junction box as set forth in claim 7 wherein said programmable circuit integration member is a circuit card insertable into said body member along a said pair of card guide means from said front face, to a selected array of card connectors of said backplane assembly with terminals of said selected array connected with said circuits extending to said terminals of said input/output connectors and connected to said circuits extending to said terminals of remaining ones of said card connectors.

9. A junction box as set forth in claim 1 wherein said backplane assembly is affixed to said rear wall to define a subassembly which is adapted to be positioned rearward of said card-receiving region of said body member upon affixing said rear wall to said body member.

10. A junction box as set forth in claim 9 wherein said interior wall is joined to said rear wall by a to plurality of struts being affixed to peripheral edges of said interior wall and said rear wall, in said subassembly.

11. A junction box as set forth in claim 10 wherein one of said opposing side walls and said top and bottom walls of said body member include channels extending forwardly from said rear edges thereof, and said struts are oriented parallel to said channels, enabling said subassembly to be inserted into said body member in a manner precisely positioning said interior wall within said body member with respect to said card guide means upon assembly of said backplane assembly in the junction box, and providing support for said interior wall during insertion and removal of said circuit cards during in-service use.

* * * * *